(12) United States Patent
Chang

(10) Patent No.: US 7,319,252 B2
(45) Date of Patent: Jan. 15, 2008

(54) METHODS FOR FORMING SEMICONDUCTOR WIRES AND RESULTING DEVICES

(75) Inventor: Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/880,294

(22) Filed: Jun. 28, 2004

(65) Prior Publication Data
US 2005/0285149 A1 Dec. 29, 2005

(51) Int. Cl.
*H01L 29/78* (2006.01)
*H01L 27/12* (2006.01)

(52) U.S. Cl. .............. 257/288; 257/296; 257/347; 257/E27.112

(58) Field of Classification Search ............ 257/288, 257/330, 347, 350, 368, 296, E27.112
See application file for complete search history.

(56) References Cited

U.S. PATENT DOCUMENTS

| | | | |
|---|---|---|---|
| 5,578,513 A | | 11/1996 | Maegawa |
| 5,646,058 A | * | 7/1997 | Taur et al. ............... 438/283 |
| 6,010,921 A | * | 1/2000 | Soutome .................. 438/151 |
| 6,137,150 A | | 10/2000 | Takeuchi et al. |
| 6,290,510 B1 | | 9/2001 | Fork et al. |
| 6,372,604 B1 | * | 4/2002 | Sakai et al. ............... 438/425 |
| 6,413,802 B1 | | 7/2002 | Hu et al. |
| 6,423,992 B2 | * | 7/2002 | Fukuda et al. ............ 257/288 |
| 6,503,800 B2 | * | 1/2003 | Toda et al. ................ 438/279 |
| 6,509,234 B1 | * | 1/2003 | Krivokapic ................ 438/270 |
| 6,595,787 B2 | | 7/2003 | Fork et al. |
| 6,759,710 B2 | * | 7/2004 | Chan et al. ............... 257/346 |
| 6,930,030 B2 | * | 8/2005 | Rausch et al. ............ 438/589 |
| 6,982,460 B1 | * | 1/2006 | Cohen et al. ............. 257/331 |
| 2002/0090966 A1 | * | 7/2002 | Hansen et al. ............ 455/522 |
| 2002/0177282 A1 | | 11/2002 | Song |

FOREIGN PATENT DOCUMENTS

WO   WO 2004/093181 A1   10/2004

OTHER PUBLICATIONS

Peter Schubert et al, A New Epitaxy Techique for Devices Isolation and Advance Device Structures, 1989 IEEE, pp. 1-3.
Chul Lee, et al., Enhanced Data Retention of Damascene-finFET DRAM with Local Channel Implantation as <100> Fin Surface Orientation Engineering, Samsung Electronics, 2004 IEEE , Korea.
PCT International Search Report, PCT Application No. PCT/US2005/021911, filed Jun. 20, 2005, 11 pages.
Office Action mailed Mar. 30, 2006, U.S. Appl. No. 10/879,765, filed Jun. 28, 2004, 7 pages.

* cited by examiner

*Primary Examiner*—T. N. Quach

(57) ABSTRACT

Methods for forming a wire from silicon or other semiconductor material are disclosed. Also disclosed are various devices including such a semiconductor wire. According to one embodiment, a wire is spaced apart from an underlying substrate, and the wire extends between a first end and an opposing second end, each of the first and second ends being affixed to the substrate. Other embodiments are described and claimed.

25 Claims, 24 Drawing Sheets

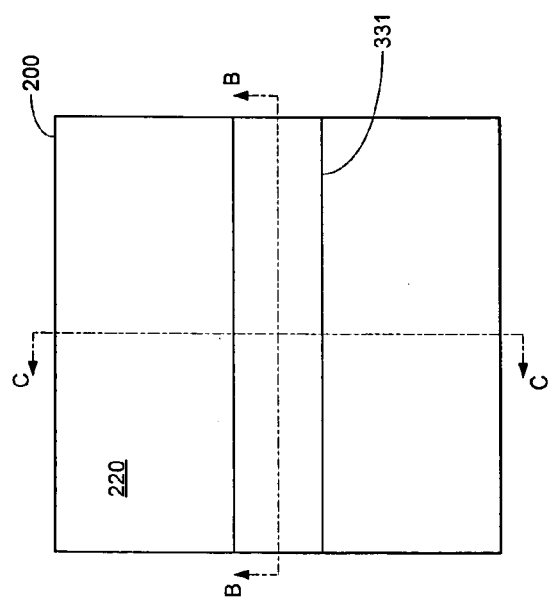
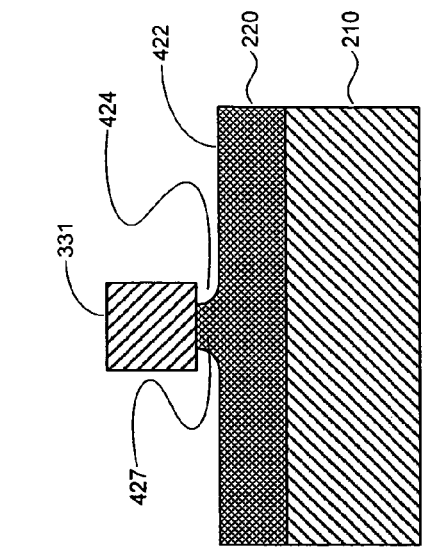
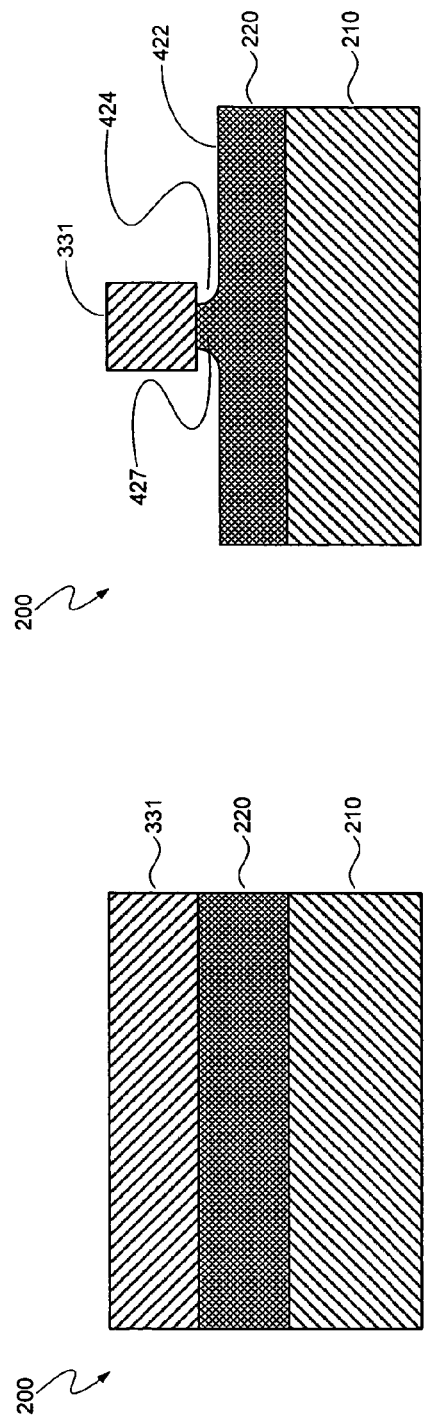
FIG. 4A
FIG. 4B
FIG. 4C

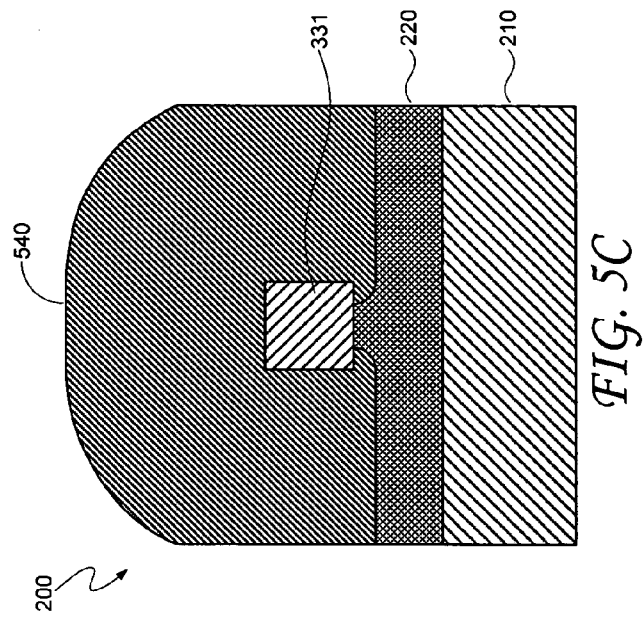
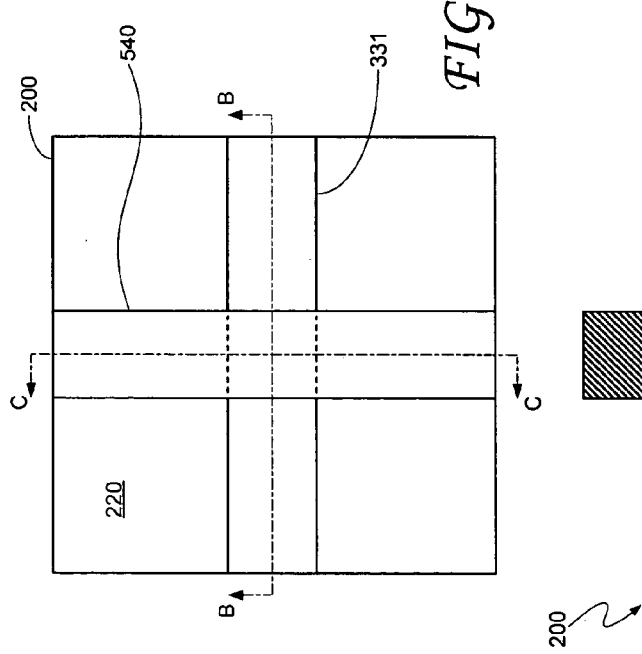
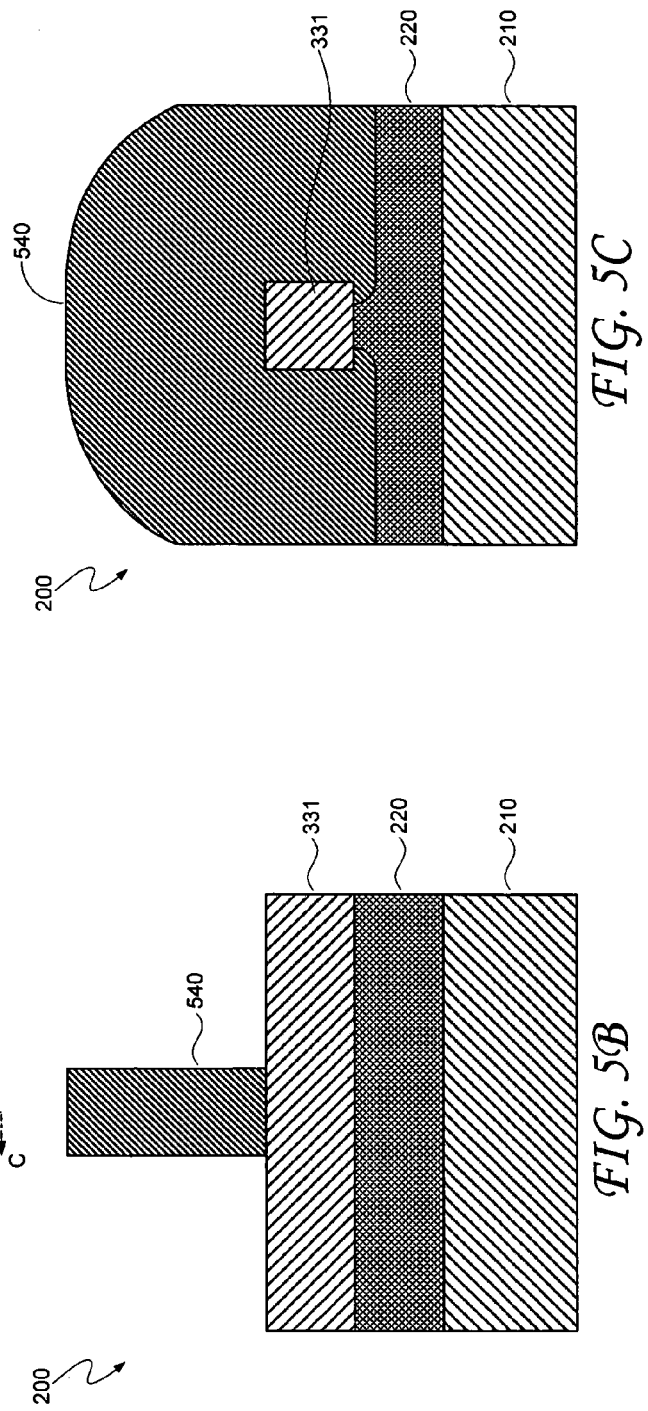

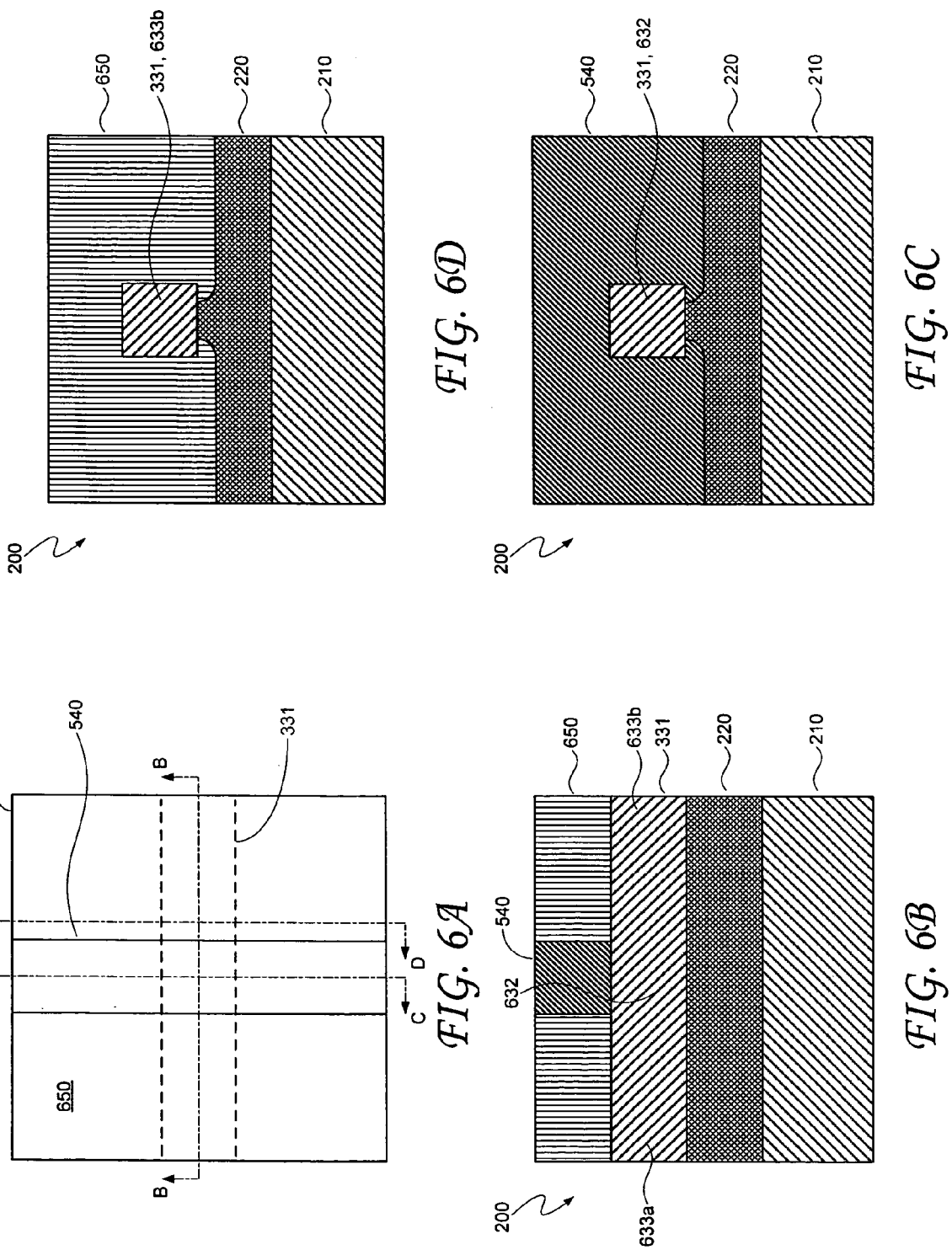

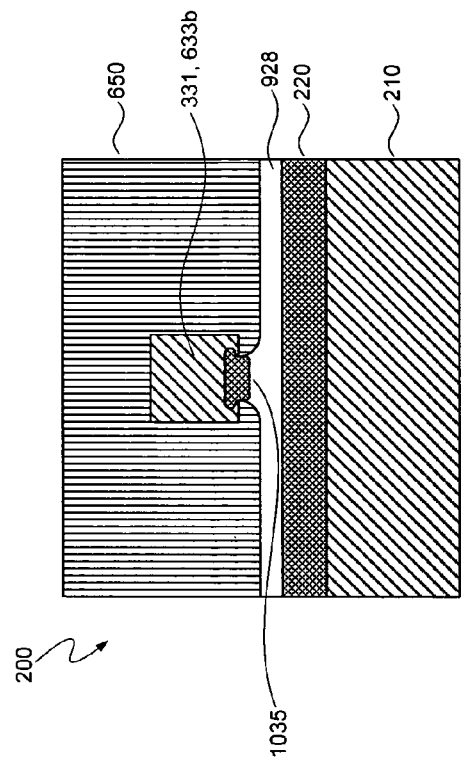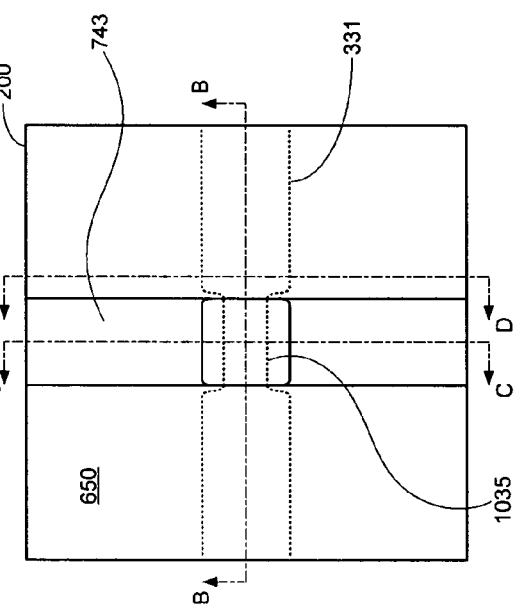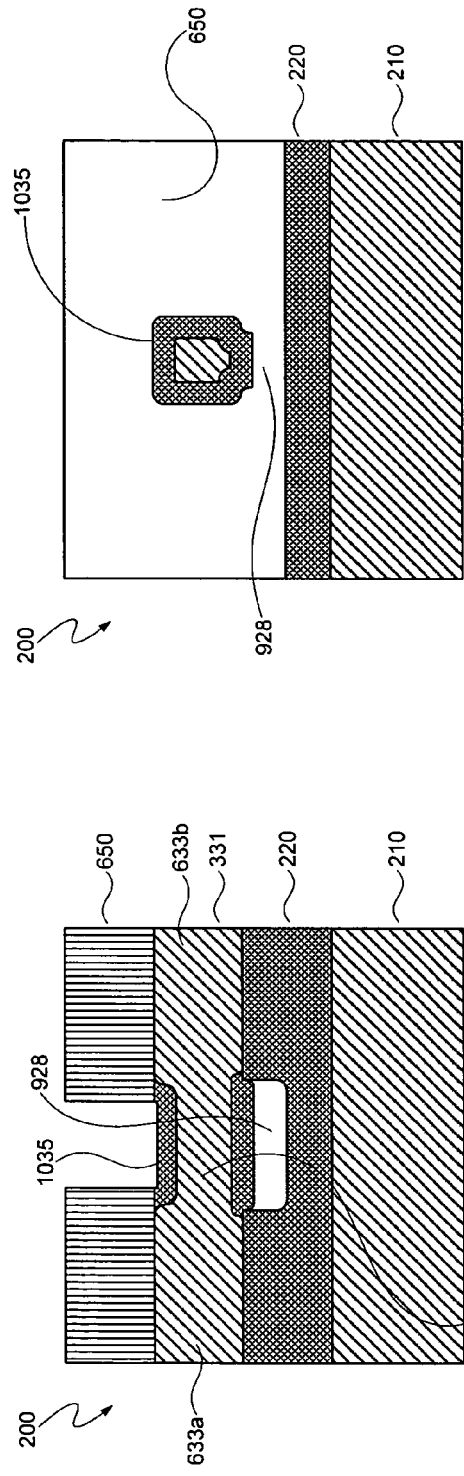

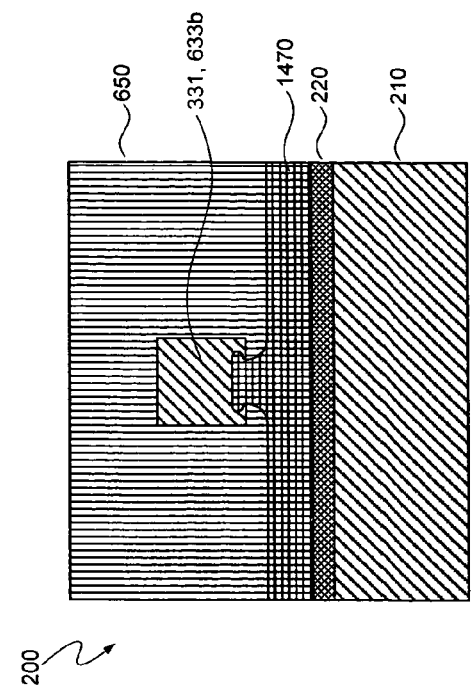
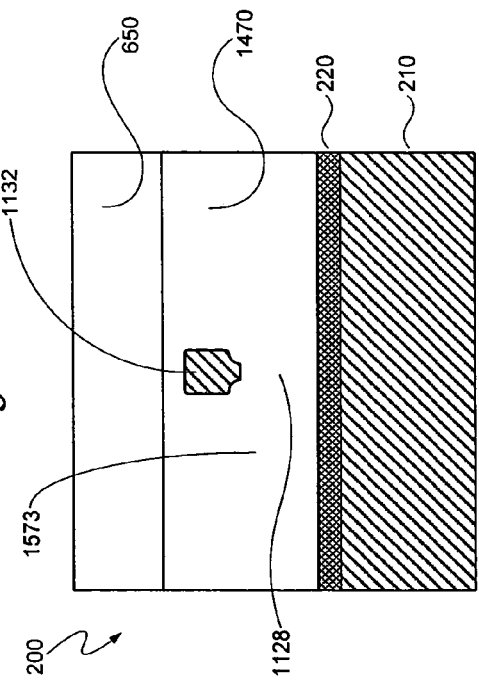
FIG. 15D
FIG. 15C
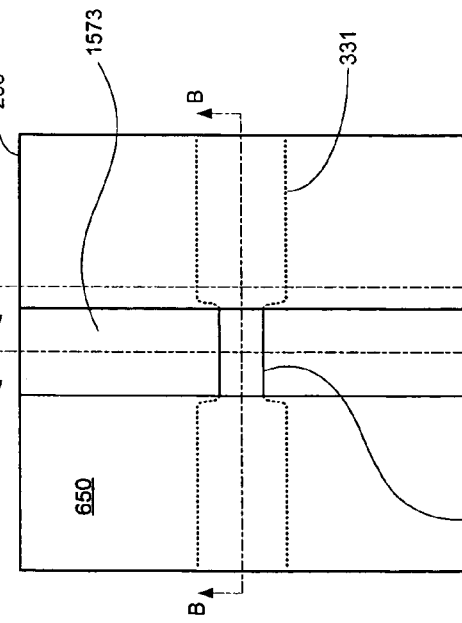
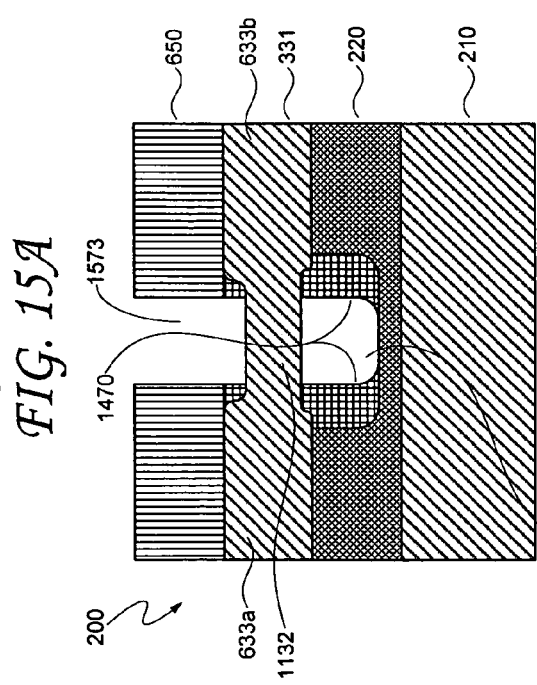
FIG. 15A
FIG. 15B

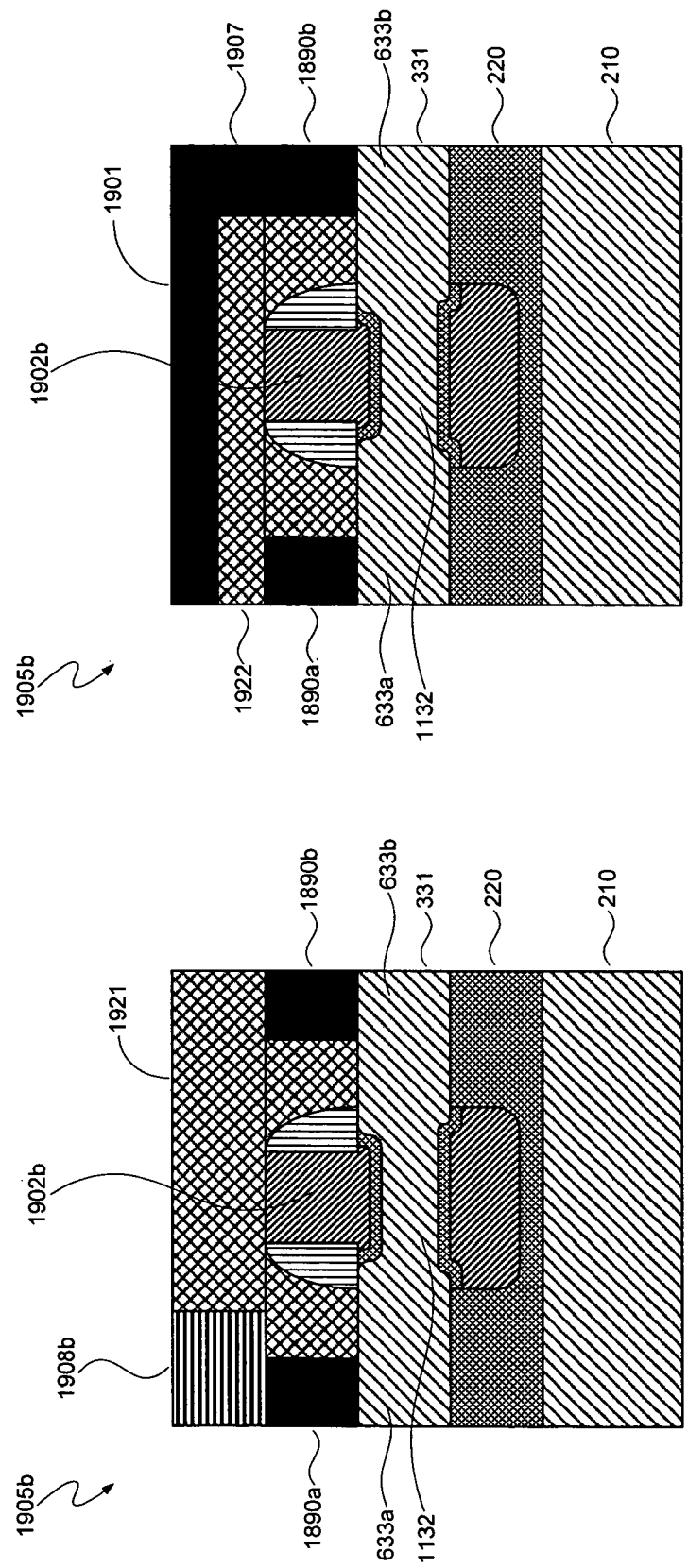

METHODS FOR FORMING SEMICONDUCTOR WIRES AND RESULTING DEVICES

RELATED APPLICATION

This application is related to U.S. patent application Ser. No. 10/879,765, entitled "Methods for Forming Semiconductor Wires and Resulting Devices," filed on even date herewith.

FIELD OF THE INVENTION

The invention relates generally to the manufacture of integrated circuit devices and, more particularly, to the formation of wires in silicon or other semiconductor materials.

BACKGROUND OF THE INVENTION

A modern microprocessor may include several million transistors and other circuit elements (e.g., resistors, capacitors, diodes, etc.) formed on a semiconductor die. Transistors may be used to form both logic circuitry and memory circuitry (e.g., SRAM or DRAM) on a processing device. In future generations of processors, as well as other integrated circuit devices, it is expected that the number of transistors will continue to increase. At the same time, however, it may be desirable to decrease die size. Thus, semiconductor manufacturers may be faced with the problem of fabricating increasing numbers of transistors on a smaller semiconductor "footprint." One way to increase the number of transistors while decreasing die size is to shrink the size of the transistors themselves. However, as manufacturers reduce the feature sizes of transistors, the capabilities of conventional lithography may eventually be exceeded.

BRIEF DESCRIPTION OF THE DRAWINGS

FIGS. 4A–4C are schematic diagrams illustrating embodiments of the method shown in FIG. 1.

FIGS. 5A–5C are schematic diagrams illustrating embodiments of the method shown in FIG. 1.

FIGS. 6A–6D are schematic diagrams illustrating embodiments of the method shown in FIG. 1.

FIGS. 10A–10D are schematic diagrams illustrating embodiments of the method shown in FIG. 1.

FIGS. 15A–15D are schematic diagrams illustrating embodiments of the method shown in FIG. 1.

FIGS. 19A–19C are schematic diagrams illustrating an embodiment of a memory device including a wire formed according to one or more of the disclosed embodiments.

DETAILED DESCRIPTION OF THE INVENTION

Disclosed herein are various embodiments of a method for forming a wire in silicon, as well as transistor devices including such a silicon wire. In one embodiment, a wire formed according to one or more of the disclosed embodiments has a diameter (or other minimum width dimension) of approximately 50 nm or less (e.g., a "nanowire"). However, it should be understood that the disclosed methods are not limited to the formation of silicon wires and that the disclosed methods may be used to fabricate wires in other semiconductor materials. It should be further understood that the disclosed embodiments are not limited to the formation of "nanowire" devices and that wires of any scale (e.g., greater than 50 nm in diameter) may be formed according to the disclosed embodiments. In addition, it should be understood that the disclosed wires are not limited in application to the formation of transistors, and in other embodiments the disclosed wires may find application in other circuit elements or devices.

Figure 1:
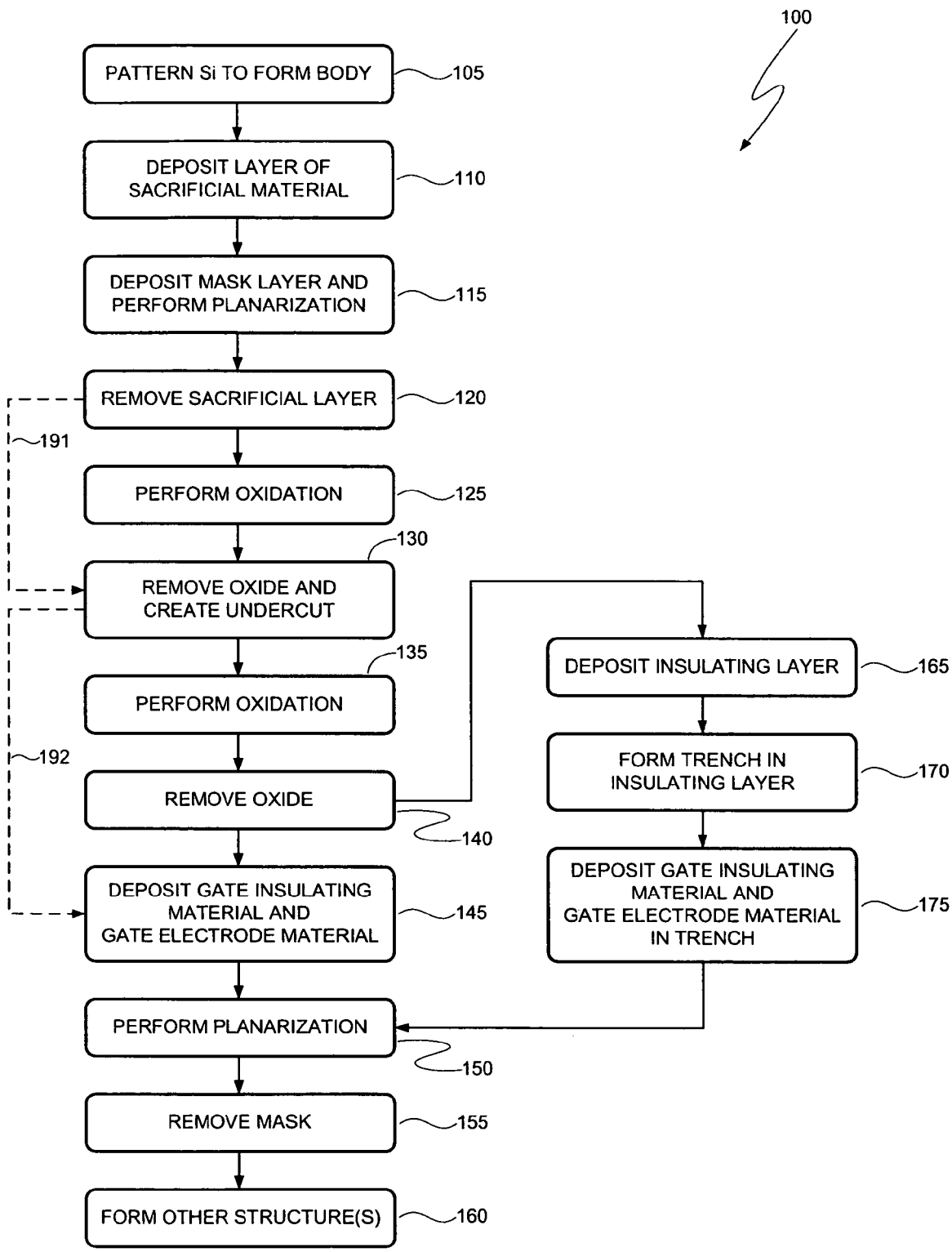
FIG. 1 is a block diagram illustrating an embodiment of a method for forming a wire from silicon or other semiconductor material.

Illustrated in FIG. 1 are embodiments of a method for forming a wire from silicon or other semiconductor material. The method of FIG. 1 is further illustrated, by way of example, in the schematic diagrams of FIGS. 2A through 18B. Reference should be made to each of FIGS. 2A through 18B, as called out in the text below.

Figure 2A:
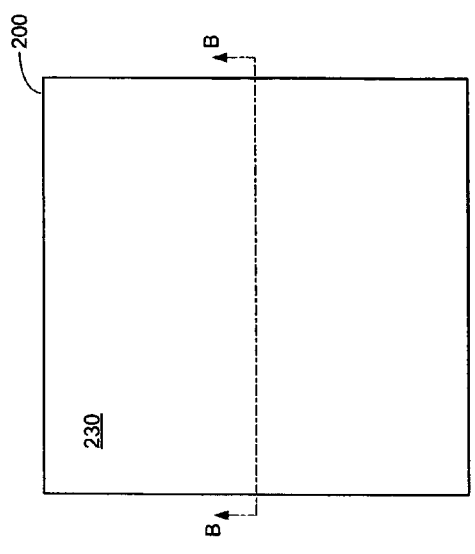
FIGS. 2A–2B are schematic diagrams illustrating embodiments of the method shown in FIG. 1.
Figure 2B:
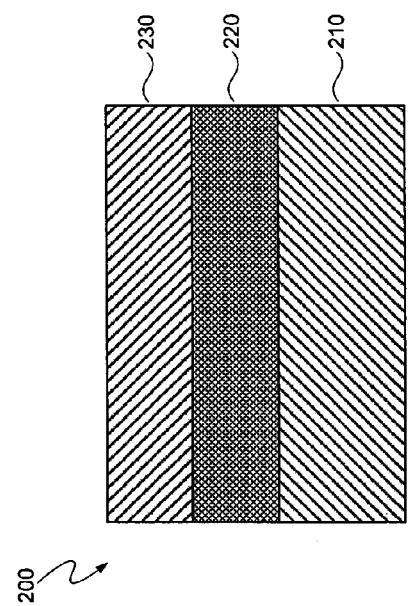

Referring first to FIGS. 2A and 2B, a substrate 200 is shown. A plan view of the substrate is shown in FIG. 2A, and a cross-sectional view of the substrate, as taken along line B—B in FIG. 2A, is shown in FIG. 2B. In one embodiment, the substrate 200 comprises a base layer of a semiconductor material 210, a layer of an insulating material 220 overlying the base layer 210, and a layer of a semiconductor material 230 overlying the insulating layer 220. Substrate 200 may, in one embodiment, comprise a wafer upon which a number of integrated circuit (IC) devices are to be formed. In one embodiment, the semiconductor layer 230 comprises silicon, and the insulating layer 220 comprises silicon dioxide ($SiO_2$). In another embodiment, the base layer 210 also comprises silicon. In one embodiment, the substrate 200 comprises a silicon-on-insulator (SOI) wafer. For ease of explanation, in the following description, it is assumed that the semiconductor layer 230 comprises silicon and, further, that a wire will be formed from silicon. However, it should be understood that the disclosed embodiments are not limited to the use of silicon and, further, that the substrate 200 and disclosed wires may comprise other semiconductor materials (e.g., silicon carbide).

Figure 3A:
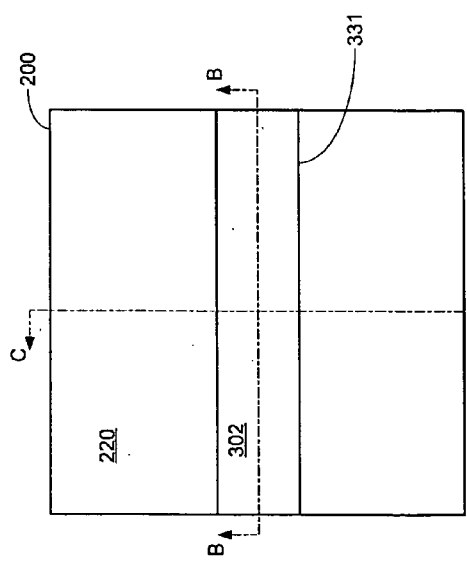
FIGS. 3A–3C are schematic diagrams illustrating embodiments of the method shown in FIG. 1.
Figure 3C:
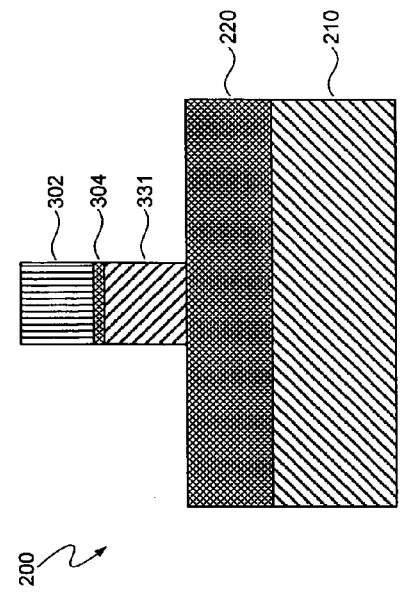
Figure 3B:
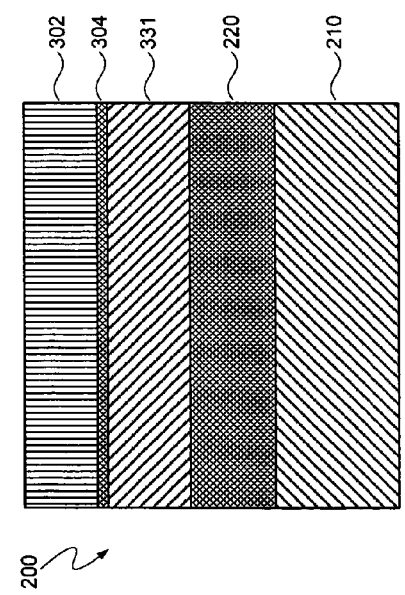
Figure 7A:
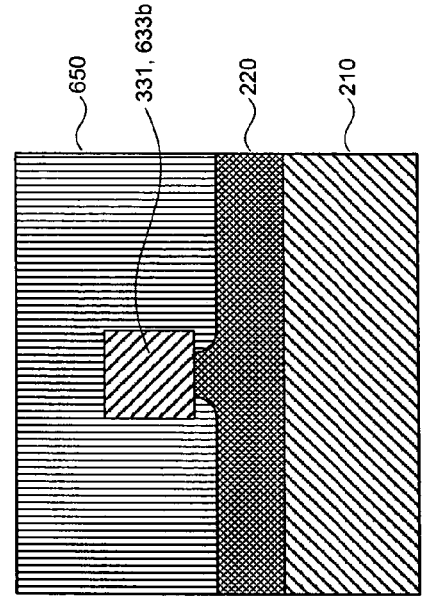
FIGS. 7A–7D are schematic diagrams illustrating embodiments of the method shown in FIG. 1.
Figure 7B:
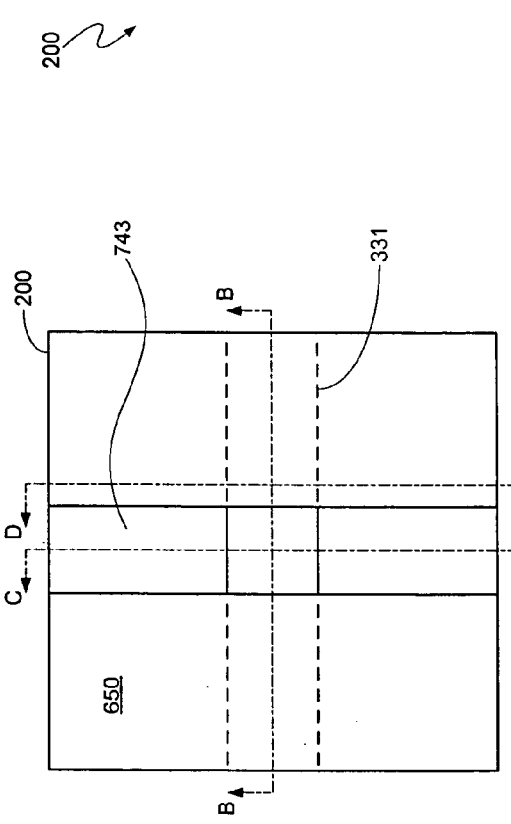
Figure 7C:
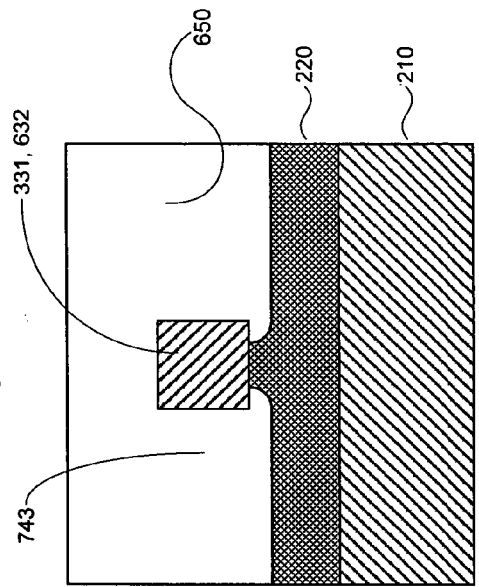
Figure 7D:
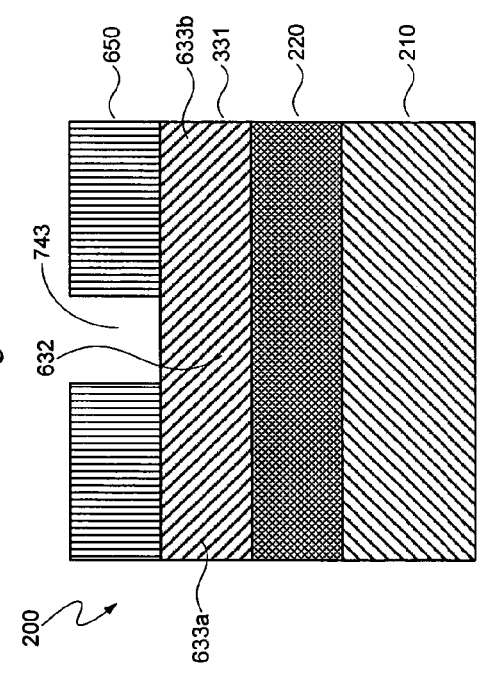
Figure 8D:
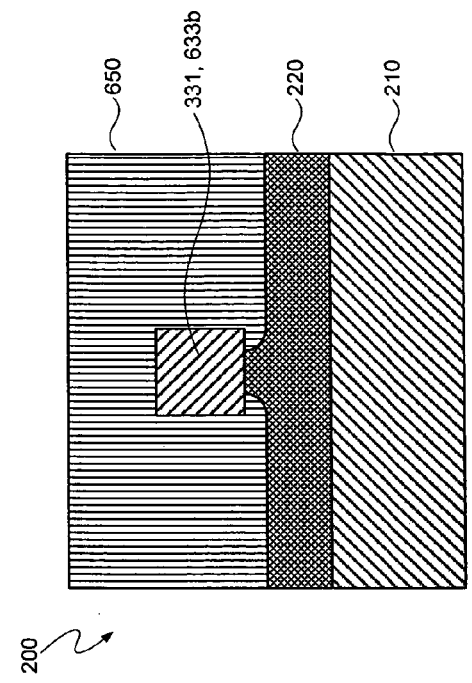
FIGS. 8A–8D are schematic diagrams illustrating embodiments of the method shown in FIG. 1.
Figure 8C:
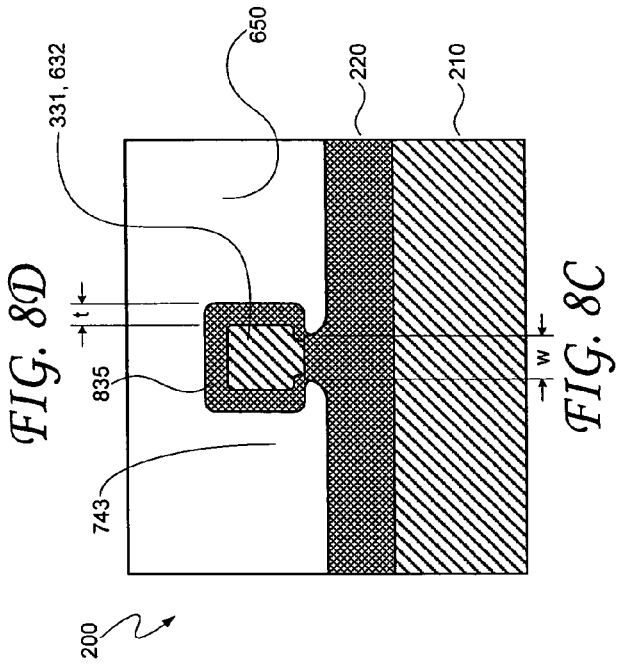
Figure 8A:
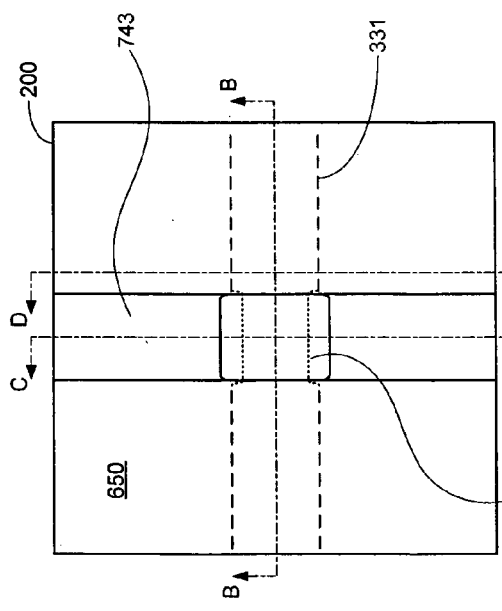
Figure 8B:
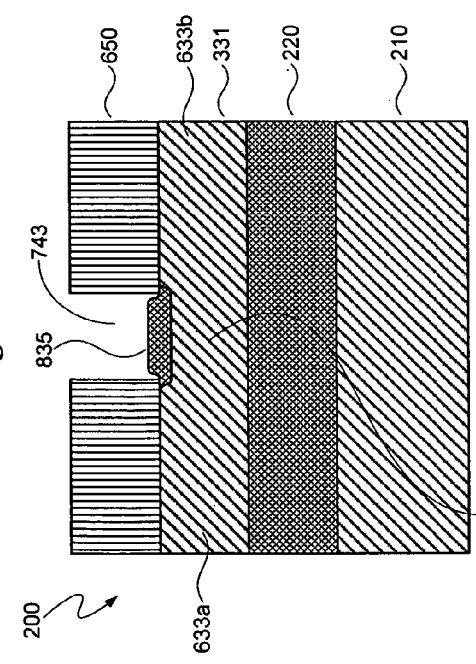
Figure 9A:
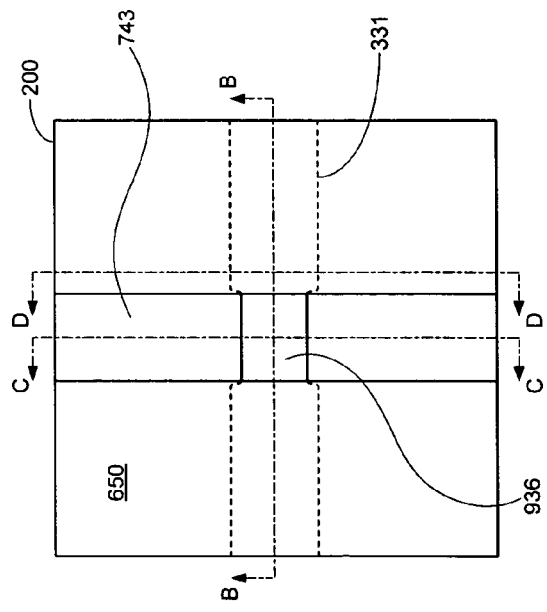
FIGS. 9A–9D are schematic diagrams illustrating embodiments of the method shown in FIG. 1.
Figure 9B:
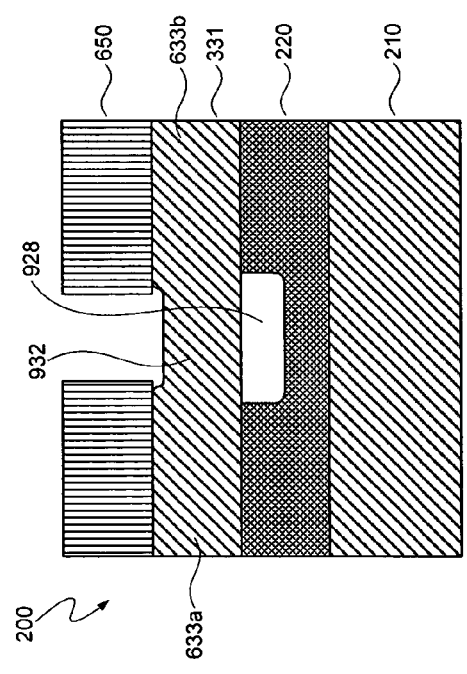
Figure 9D:
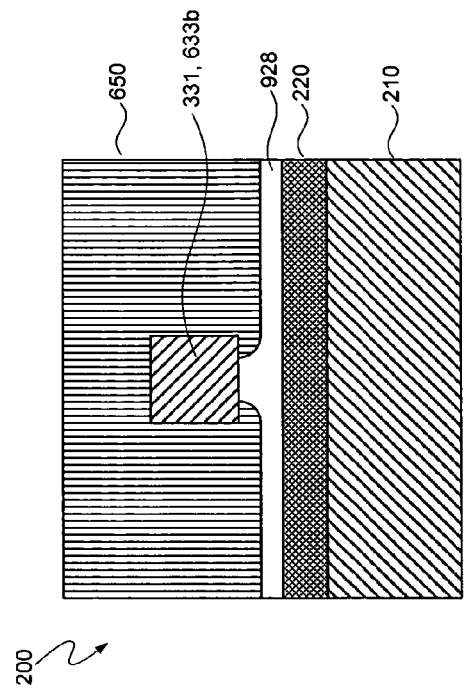
Figure 9C:
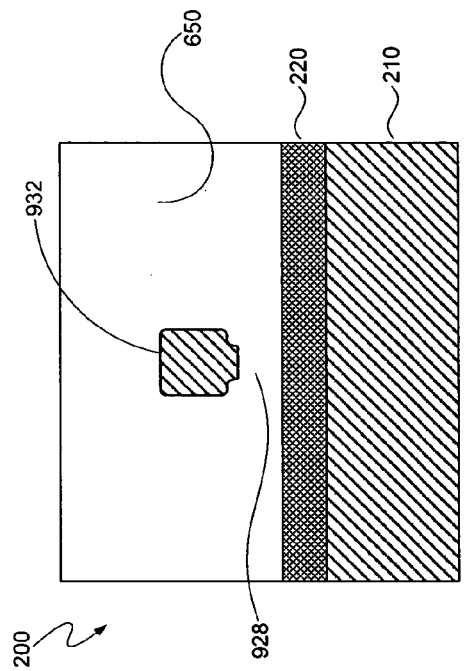
Figure 11D:
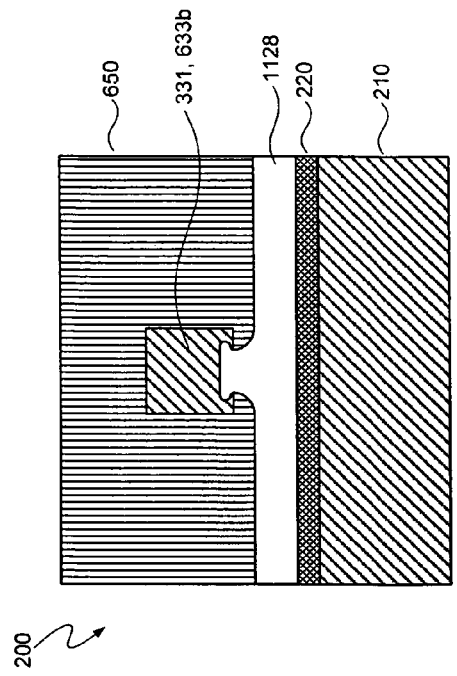
FIGS. 11A–11D are schematic diagrams illustrating embodiments of the method shown in FIG. 1.
Figure 11C:
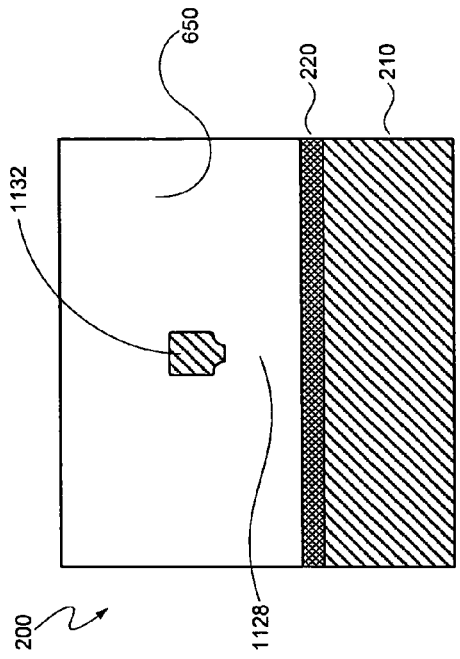
Figure 11A:
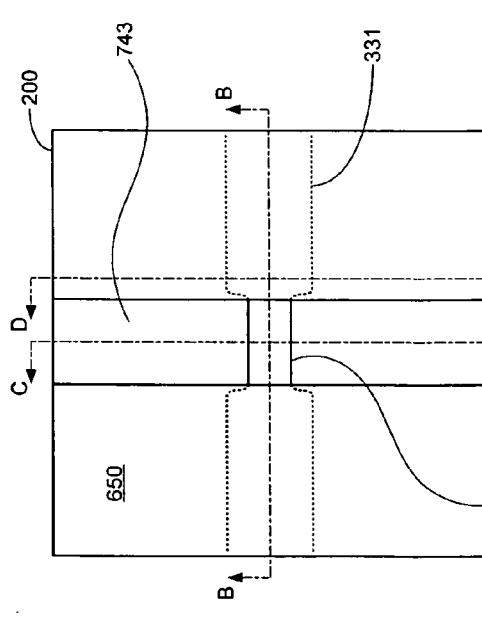
Figure 11B:
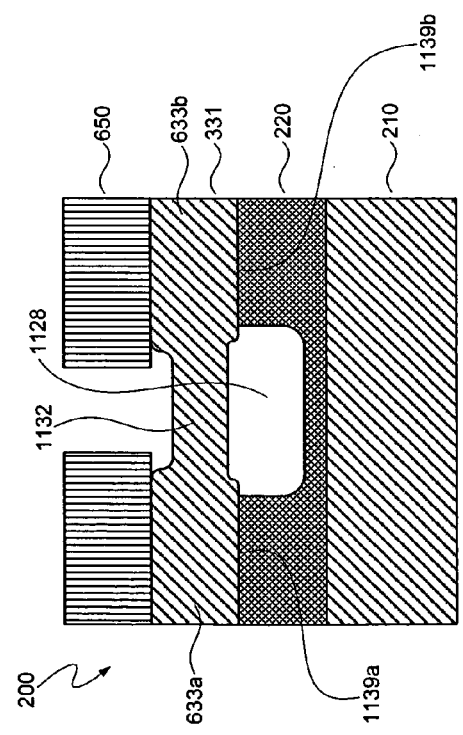
Figure 12A:
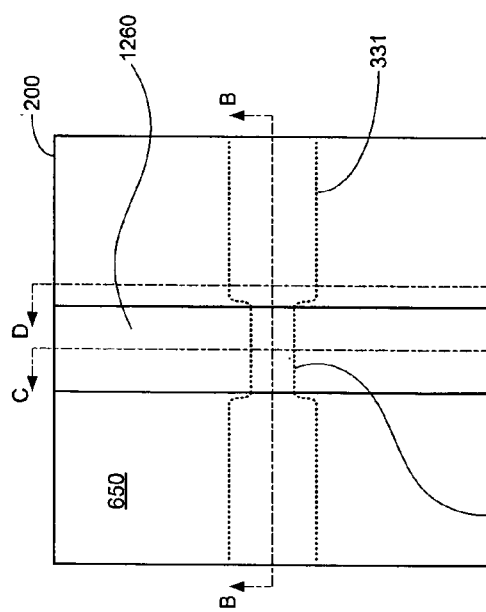
FIGS. 12A–12D are schematic diagrams illustrating embodiments of the method shown in FIG. 1.
Figure 12B:
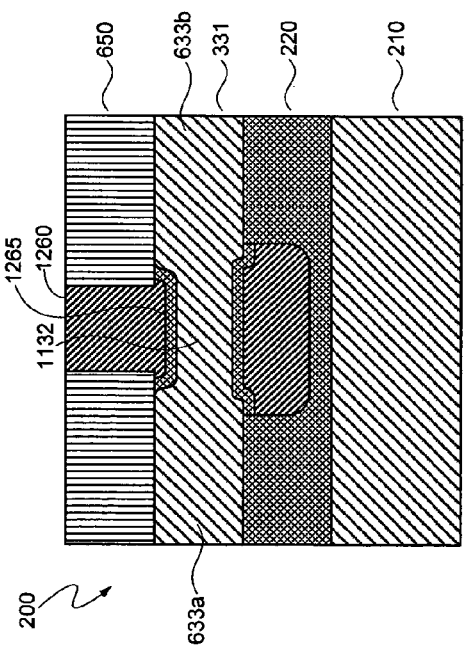
Figure 12D:
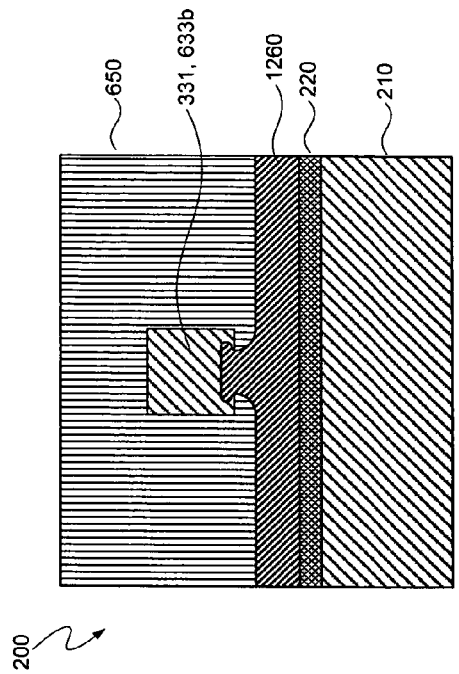
Figure 12C:
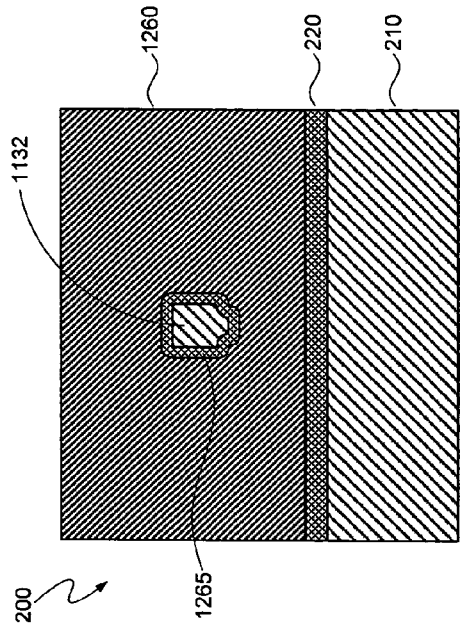
Figure 13A:
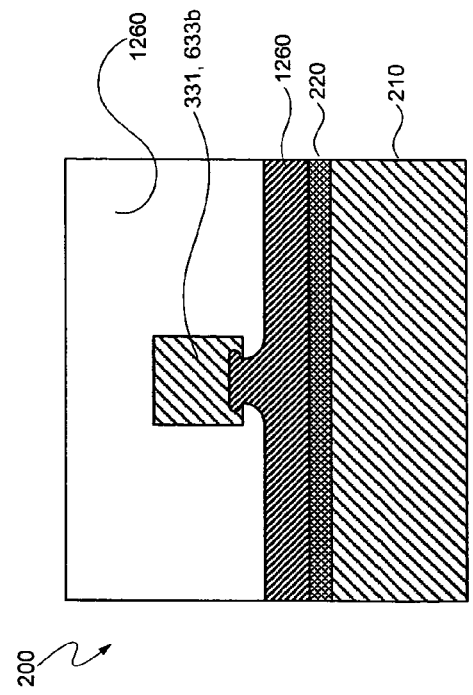
FIGS. 13A–13D are schematic diagrams illustrating embodiments of the method shown in FIG. 1.
Figure 13D:
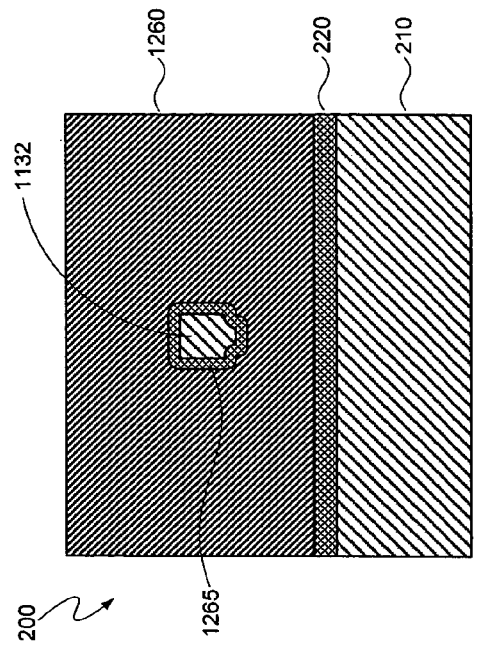
Figure 13B:
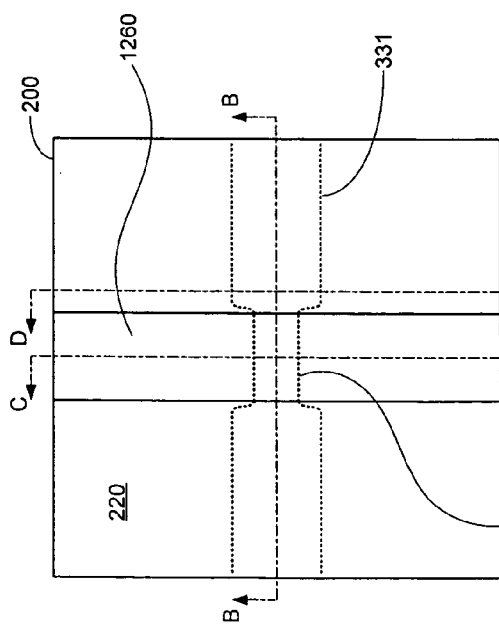
Figure 13C:
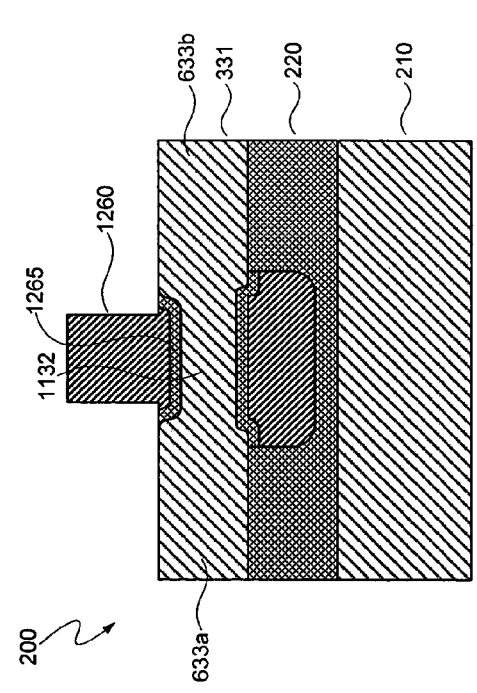
Figure 14A:
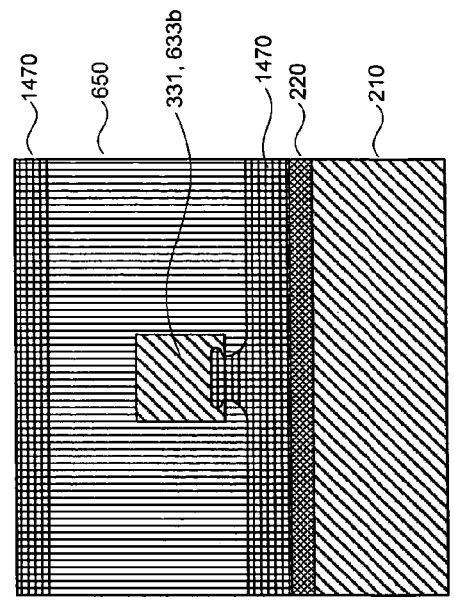
FIGS. 14A–14D are schematic diagrams illustrating embodiments of the method shown in FIG. 1.
Figure 14B:
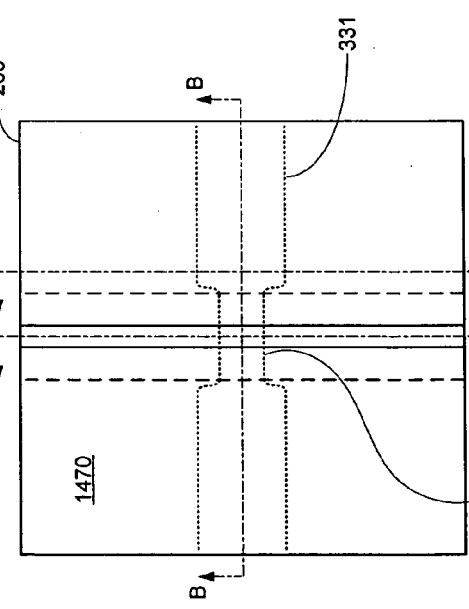
Figure 14D:
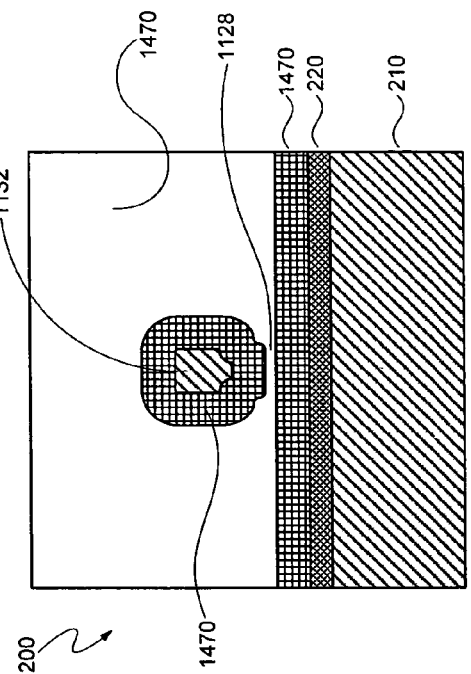
Figure 14C:
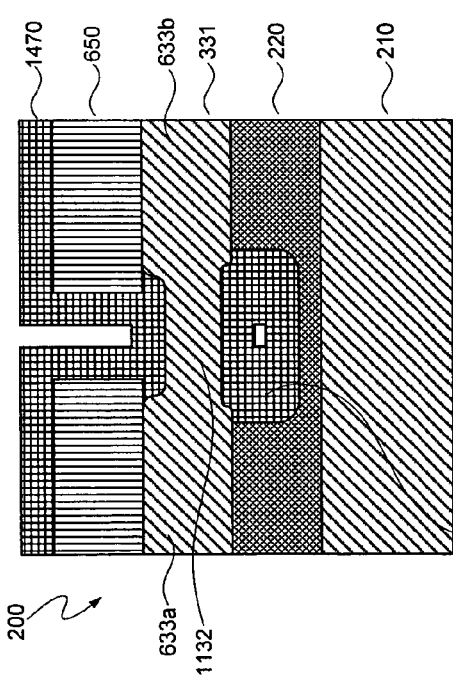
Figure 16A:
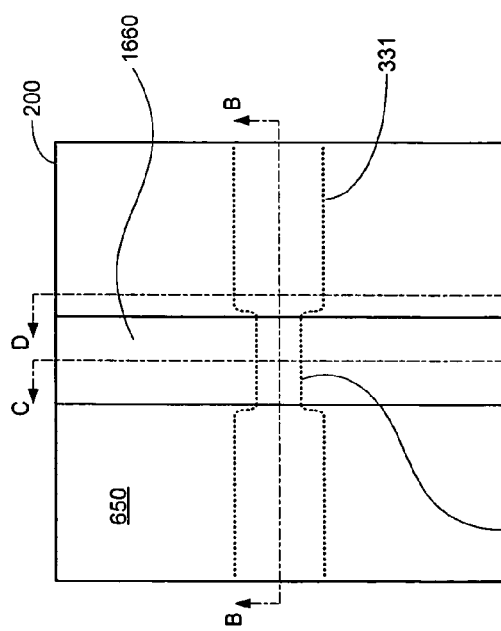
FIGS. 16A–16D are schematic diagrams illustrating embodiments of the method shown in FIG. 1.
Figure 16B:
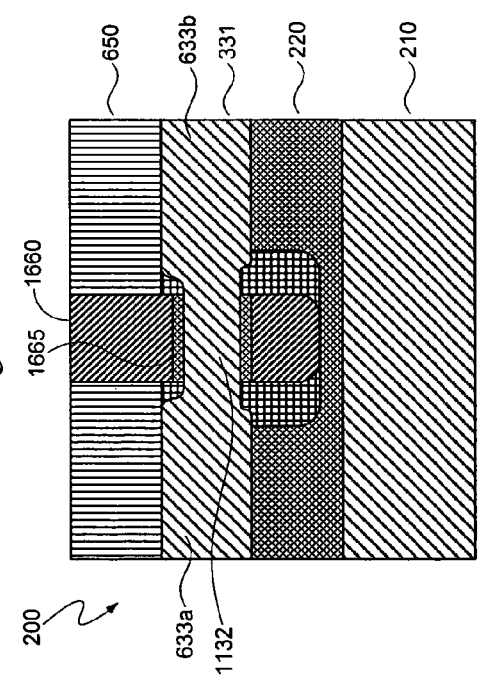
Figure 16D:
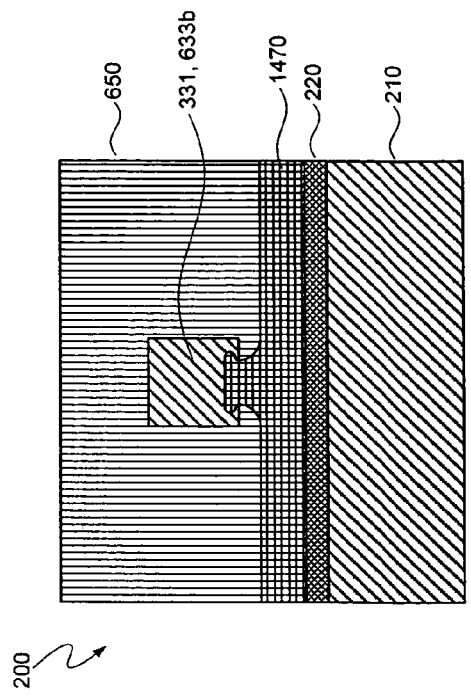
Figure 16C:
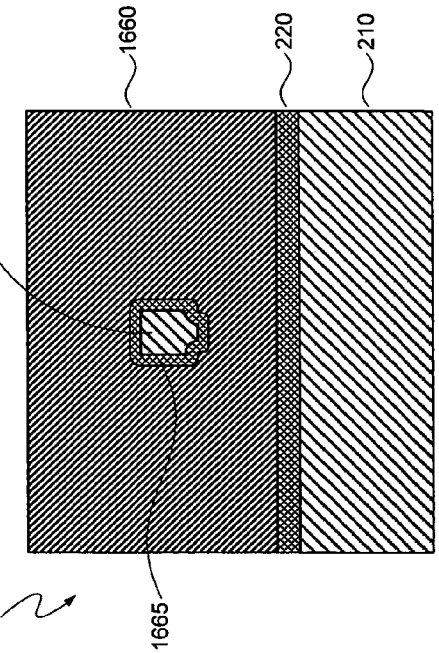

Turning now to FIG. 1, and block 105 in particular, a silicon layer on a substrate is patterned. This is illustrated in FIGS. 3A through 3C, where the silicon layer 230 on substrate 200 has been patterned into a desired shape. A plan view of the substrate and patterned silicon layer are shown in FIG. 3A, whereas cross-sectional views of the substrate and patterned silicon layer, as taken along lines B—B and C—C of FIG. 3A, are shown in FIGS. 3B and 3C, respectively (note that the same relationships exist between figures A, B, and C of FIGS. 4 through 17). In one embodiment, as shown in the figures, the silicon layer 230 has been pattered to form a silicon body 331. According to one embodiment, the silicon body comprises a generally rectangular parallelepiped shaped structure having a length that is greater than a width and height of the structure, as shown in the figures. However, it should be understood that the silicon body may have any suitable shape and configuration.

Any suitable photolithography and etching processes may be utilized to pattern the silicon layer 230. In one embodiment, as shown in FIG. 3C, during photolithography, a mask layer 302 will be deposited over an upper surface of the silicon layer 230, and a barrier layer 304 will be disposed between the mask layer 302 and the silicon layer 230. The barrier layer 304, which may comprise an oxide material (e.g., $SiO_2$), prevents diffusion of the mask layer 302 (e.g., SiN) into the underlying silicon layer 230, and this barrier layer 304 may also function as a stress relief between the mask layer and the underlying silicon layer. After removal of the mask layer 302, the barrier layer 304 is removed. In one embodiment, this barrier layer 304 comprises an oxide material that is removed by an etching process. During etching of the oxide barrier layer 304, a portion of the insulating layer 220 is also removed, which may result in partial undercut regions 424 underneath the silicon body 331, as shown in FIGS. 4A–4C (which show the substrate 200 and silicon body 331 after removal of the mask and barrier layers). As shown in FIG. 4C, after the partial undercut etch, a portion 427 of the insulating layer 220 remains in contact with the silicon body 331 and affixes the body to the substrate.

As set forth in block 110 of FIG. 1, a layer of sacrificial material is deposited over the silicon body. This is illustrated in FIGS. 5A through 5C, which show a layer of sacrificial material 540 that has been formed over a portion of the silicon body 331. In one embodiment, where a transistor device is to be formed, the sacrificial layer 540 overlies that region of the silicon body 331 corresponding to a gate. Any suitable process or combination of processes may be employed to deposit the sacrificial layer 540. According to one embodiment, a blanket layer of the sacrificial material is deposited followed by photolithography and subsequent etching to yield the sacrificial layer 540 covering a portion of silicon body 331, as shown in FIGS. 5A–5C. Any suitable blanket deposition technique may be employed to form the sacrificial layer, including chemical vapor deposition (CVD), physical vapor deposition (PVD), etc. The sacrificial layer 540 may comprise any suitable material and, in one embodiment, the sacrificial material comprises polysilicon.

Referring to block 115, a mask layer is deposited over the substrate and planarization is subsequently performed. This is illustrated in FIGS. 6A through 6D, where FIG. 6D shows a cross-sectional view of the substrate as taken along line D—D of FIG. 6A (a similar relationship existing between figures A and D of FIGS. 7 through 14). As shown in these figures, a mask layer 650 has been deposited over portions of the substrate 200 (e.g., those portions not underlying sacrificial layer 540). More specifically, the sacrificial layer 540 overlies an inner region 632 of silicon body 331, whereas the mask layer 650 overlies opposing outer regions 633a, 633b of the silicon body 331.

Any suitable deposition technique may be used to deposit mask layer 650 (e.g., CVD, PVD, etc.). Also, any suitable planarization process—such as, for example, chemical-mechanical polishing (or CMP)—may be used to planarize the mask layer 650 (and sacrificial layer 540). The mask layer 650 may comprise any suitable material, and in one embodiment, the mask layer 650 comprises silicon nitride (SiN). Also, according to one embodiment, prior to deposition of the mask layer 650, a barrier layer (not shown in figures) may be formed over those portions of the silicon body 331 that will underlie the mask layer 650 (in another embodiment, the barrier layer may be formed over the silicon body prior to deposition of the sacrificial layer 540). This barrier layer (e.g., an oxide material such as $SiO_2$) will inhibit diffusion of the mask material (e.g., SiN) into the silicon body 331.

As set forth in block 120, the sacrificial layer is removed. This is shown in FIGS. 7A through 7D, where the sacrificial layer 540 has been removed to form a trench 743 extending through the mask layer 650 and down to the underlying insulating layer 220. At least some (or all) of the inner region 632 of silicon body 331 is exposed within the trench 743. Any suitable process may be used to remove the sacrificial layer 540. For example, the sacrificial material may be removed by an etching process using a solution including potassium hydroxide (KOH).

It should be understood that the sacrificial layer, which may comprise polysilicon, may not be removed from all portions of the wafer (or die) upon which the disclosed wire (or wires) is being formed. Although, according to some embodiments, the sacrificial material is removed to form trench 743 that exposes the inner region 632 of silicon body 331, this sacrificial material layer may form a part of other devices also being fabricated on the wafer (or die). For example, where the sacrificial material is polysilicon, the polysilicon layer (which is the sacrificial material 540 in some embodiments) may comprise the gate material for other transistor devices, and the polysilicon material may not be removed from areas of the wafer where these other devices are being formed. To protect the sacrificial material layer on those areas of the wafer where the sacrificial material (e.g., polysilicon) is desired, a passivation layer (e.g., an oxide material, such as $SiO_2$) may be deposited after planarization (see bock 115). This passivation layer would then be partially removed to "open up" the regions of the wafer (or die) where the disclosed semiconductor wires are to be formed. The remainder of the passivation layer may then be removed at a subsequent planarization step (see block 150).

In FIGS. 5A through 7D, the trench 743 was formed in mask layer 650 by first depositing a sacrificial material followed by deposition of the mask layer, and then subsequently removing the sacrificial material to form the trench (as set forth in block 120). However, in another embodiment, a mask layer having trench 743 is formed by depositing a blanket layer of the mask material (e.g., SiN), and then forming the trench by subsequently patterning (e.g., using a negative photoresist) and etching the mask layer. In this embodiment, a sacrificial layer 540 (see block 110) may not be deposited.

In one embodiment, as set forth in block 125, after formation of the trench 743 exposing the inner region 632 of the silicon body 331, oxidation is performed. This is illustrated in FIGS. 8A through 8D, which shows a layer of oxide 835 (e.g., SiO$_2$) that has been formed over the exposed inner region 632 of the silicon body 331. In one embodiment, the oxide layer 835 is formed by thermally oxidizing the silicon body 331, wherein interior regions of the body remain unoxidized. In one embodiment, where thermal oxidation is utilized to form the oxide layer 835, the ratio of the volume of oxide grown (e.g., SiO$_2$) to the volume of body 331 (e.g., Si) that is consumed during the oxidation process may be approximately 2 to 1. The thickness (t) of the oxide layer 835 surrounding the unoxidized core of silicon body 331 is, in one embodiment, approximately one-half the width (w) of the portion of underlying insulating layer 220 that is in contact with the body 331 (see FIG. 8C).

Referring now to block 130 in FIG. 1, the oxide layer is removed and an undercut is created to separate a portion of the silicon body from the underlying substrate. This is illustrated in FIGS. 9A through 9D, where the oxide layer 835 has been removed from the silicon body 331 to form an inner region 932 having reduced dimensions. The inner region 932 extends between the opposing outer regions 633a, 633b (which underlie the mask layer 650), and the inner region 932 is separated from (and suspended above) the substrate 200 by an undercut region 928 formed in the insulating layer 220 of the substrate. The undercut region 928 is formed by removal of the insulating layer 220 (e.g., SiO$_2$) that occurs during removal of the oxide layer 835 (e.g., SiO$_2$). In one embodiment, where the ratio of the thickness (t) of oxide layer 835 to the width (w) of underlying insulating layer 220 (the portion in contact with silicon body 331) is, at least 2 to 1, separation should occur between the unoxidized portion of body 331 (i.e., inner region 932) and the underlying insulating layer 220 when the oxide layer 835 is substantially removed. Any suitable process, such as a chemical etch process, may be employed to remove the oxide. In one embodiment, where the body 331 is formed from silicon, the oxide may be removed using a solution including hydrofluoric acid (HF). Generally, any process that removes the oxide layer 835 (and insulating layer 220) without removing the unoxidized silicon (and mask layer 650), or that removes the oxide layer (and insulating layer) at a much greater rate than the removal rate of silicon (and mask layer 650), may be used for oxide removal.

Referring next to block 135, further oxidation is performed. This is illustrated in FIGS. 10A through 10D, where the inner region 932 of silicon body 331 has been further oxidized to form an oxide layer 1035. Any suitable oxidation process (e.g., thermal oxidation) may be used to form oxide layer 1035. Again, where thermal oxidation is utilized to form the oxide layer 1035, the ratio of the volume of oxide grown (e.g., SiO$_2$) to the volume of material (e.g., Si) consumed during oxidation may be approximately 2 to 1.

It should be noted that the oxidation process (e.g., blocks 125 and/or 135) may be susceptible to a greater degree of control than conventional photolithography processes. For example, the resolution that may be achieved by photolithography may be on the order of 5 nm. In contrast, resolutions on the order of a few to several Angstroms (e.g., 9 Angstroms) may be achieved during the oxidation processes. Thus, wires with dimensions and features that may be smaller than that provided by photolithography can be formed. In addition, wires can be formed at specific locations on a wafer or other substrate.

As set forth in block 140, the oxide is removed. This is illustrated in FIGS. 11A through 11D, where the oxide layer 1035 has been removed to form an inner region 1132 having dimensions that are further reduced. Also, additional portions of the underlying insulating layer 220 are removed during the oxide removal process to form an expanded undercut region 1128. Inner region 1132 extends between the opposing outer regions 633a, 633b (which underlie the mask layer 650), and the inner region 1132 is separated from (and suspended above) the substrate 200 by the undercut region 1128. Note that the outer regions 633a, 633b remain in contact with and affixed to the underlying insulating layer 220 at regions 1139a, 1139b. Any suitable process (e.g., a chemical etch process using HF), may be employed to remove the oxide. Again, any process that removes the oxide layer 1035 (and insulating layer 220) without removing the unoxidized silicon (and mask layer 650), or that removes the oxide layer (and insulating layer) at a much greater rate than the removal rate of silicon (and mask layer 650), may be used for oxide removal.

If a transistor is to be formed, a layer of gate insulating material and a layer of gate electrode material may then be deposited over the exposed inner region of the silicon body, as set forth in block 145. This is illustrated in FIGS. 12A through 12D, which shows a gate insulating layer 1265 that has been deposited over the exposed inner region 1132 of the silicon body and, further, which shows a gate electrode layer 1260 that has been deposited over the gate insulating layer 1265 and around the exposed inner region 1132. Any suitable deposition techniques (e.g., thermal oxidation, CVD, PVD, etc.) may be employed to deposit the gate insulating material 1265, and any suitable deposition technique (e.g., CVD, PVD, etc.) may be used to deposit the gate electrode material 1260. The gate insulating layer 1265 may comprise any suitable insulating material, and in one embodiment, the gate insulating layer comprises SiO$_2$. In one embodiment, the gate insulating layer 1265 has a thickness of approximately 1 nm, or less. Gate electrode layer 1260 may comprise any suitable conductive material, and in one embodiment, the gate electrode layer comprises polysilicon. In another embodiment, the gate electrode layer 1260 may comprise a metal material (and the gate insulating layer a high-k dielectric material).

In one embodiment, prior to deposition of the gate insulating and gate electrode materials, the inner region 1132 of the silicon body may be subjected to a doping process. For a transistor, such doping—which would be self-aligned to the channel region—may improve short-channel effects. The inner region 1132 may be doped with any suitable element or material, such as boron (e.g., for an NMOS device) or arsenic (e.g., for a PMOS device). Also, any suitable doping technique may be employed to dope the inner region 1132 of the silicon body, including solid phase diffusion or plasma phase diffusion.

After deposition of the gate insulating and gate electrode materials (and, perhaps, after doping), planarization is performed, as set forth in block 150. Any suitable planarization process (e.g., CMP) may be utilized to planarize the gate electrode material 1260 and/or the mask layer 650. The result after planarization is also illustrated in FIGS. 12A–12D. Also, as described above, a passivation layer (e.g., an oxide material) may be deposited to protect those areas of the wafer (or die) where the sacrificial material (e.g., polysilicon) will not be removed, and this passivation layer may be removed from these areas by this planarization process.

Referring to block 155, the mask layer is then removed. This is illustrated in FIGS. 13A through 13D, where the mask layer 650 has been removed. Any suitable process may be employed to remove the mask layer 650. For example, where the mask layer 650 comprises SiN, the mask layer may be removed by a chemical etch process using a solution including phosphoric acid. Generally, any process that removes the mask layer 650 without removing the silicon body 331, the gate electrode material 1260, and the underlying insulating layer 220 (and gate insulating layer 1265)— or that removes the mask layer at a much greater rate than these other materials—may be used for mask removal.

In an alternative embodiment, after removal of the second oxide layer (see block 140), an insulating layer is deposited over the substrate, as set forth in block 165. This is illustrated in FIGS. 14A through 14D, where (after removal of the second oxide layer as set forth in block 140 and as shown in FIGS. 11A–11D) a layer of insulating material 1470 has been deposited over the substrate 200. The insulating layer 1470 extends down into the trench in mask layer 650 and substantially fills the undercut region 1128. In one embodiment, the insulating layer 1470 comprises an oxide material (e.g., $SiO_2$); however, it should be understood that any other suitable insulating materials may be used. Any suitable deposition techniques may be employed to deposit the insulating layer 1470, such as CVD, PVD, etc.

Referring to block 170, a trench is then formed in the insulating layer. This is illustrated in FIGS. 15A through 15D, which shows a trench 1573 that has been formed in insulating layer 1470. The trench 1573 exposed a substantial amount of the inner region 1132 of the silicon body 331; however, some of the insulating layer 1470 remains in the undercut region 1128 and around the inner region 1132 of the silicon body, as shown in FIG. 15B. Any suitable process may be utilized to form the trench 1573, such as an etching process (with the mask layer 650 functioning as a mask for formation of trench 1573). Note that, for transistor applications, filling in the undercut regions with insulating material 1470 (as shown in FIG. 15B) can reduce the gate capacitance. For some applications (e.g., logic devices), it may be desirable to reduce the gate capacitance, whereas for other applications (e.g., memory devices), the increased capacitance that can result from filling the entire undercut region with gate electrode material (see FIG. 13B) may be acceptable.

As set forth in block 175, if a transistor is to be formed, a layer of gate insulating material and a layer of gate electrode material may then be deposited over the exposed inner region of the silicon body. This is illustrated in FIGS. 16A through 16D, where a gate insulating layer 1665 has been deposited over the exposed inner region 1132 of the silicon body and a gate electrode layer 1660 has been deposited over the gate insulating layer 1665 and around the exposed inner region 1132. Any suitable deposition techniques (e.g., thermal oxidation, CVD, PVD, etc.) may be employed to deposit the gate insulating material 1665, and any suitable deposition technique (e.g., CVD, PVD, etc.) may be used to deposit the gate electrode material 1660. The gate insulating layer 1665 may comprise any suitable insulating material, and in one embodiment, the gate insulating layer comprises $SiO_2$. In one embodiment, the gate insulating layer 1665 has a thickness of approximately 1 nm, or less. Gate electrode layer 1660 may comprise any suitable conductive material, and in one embodiment, the gate electrode layer comprises polysilicon. As previously described, according to another embodiment, the gate electrode layer may comprise a metal material (and the gate insulating layer a high-k dielectric material). Also, as previously described, prior to deposition of the gate insulating and gate electrode materials (and, perhaps, prior to deposition of the insulating layer 1470), the inner region 1132 of the semiconductor body may be subjected to a doping process.

Figure 17A:
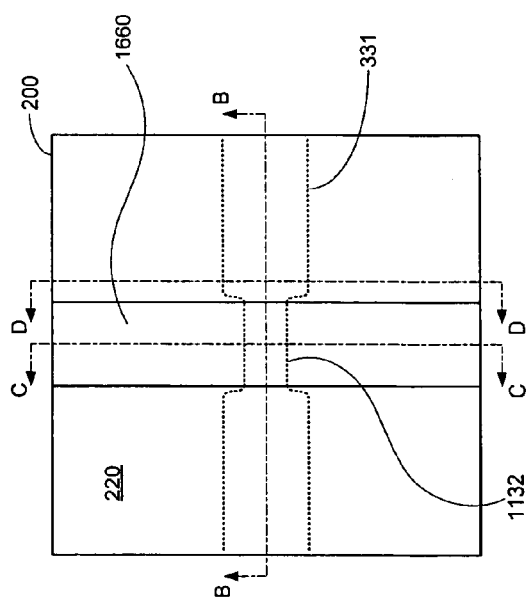
FIGS. 17A–17D are schematic diagrams illustrating embodiments of the method shown in FIG. 1.
Figure 17B:
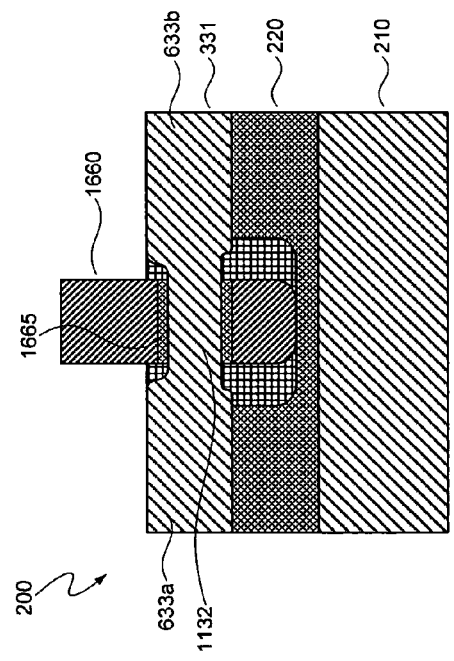
Figure 17D:
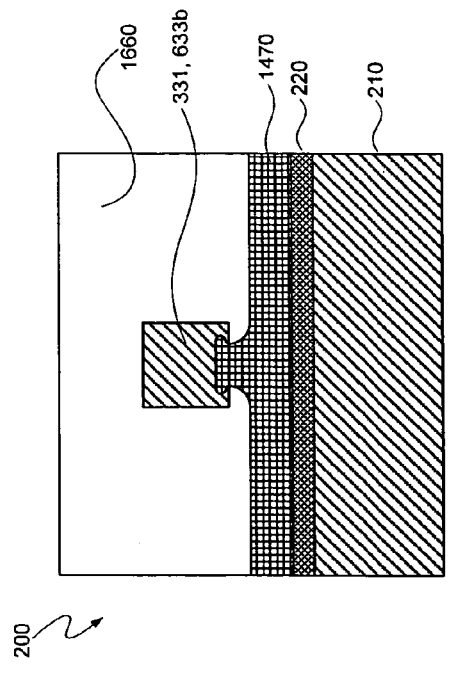
Figure 17C:
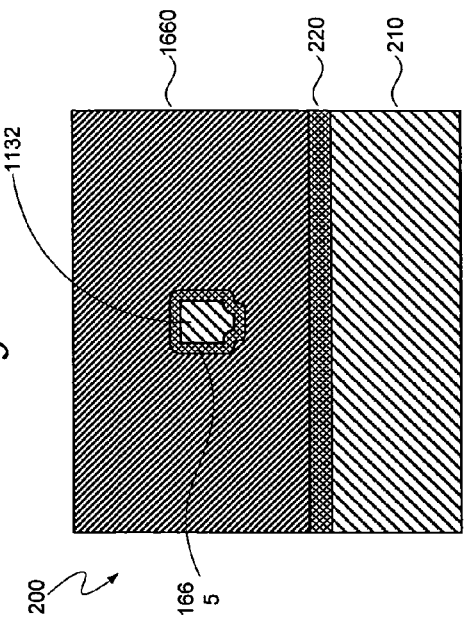

As set forth in block 150, planarization is then performed, which is also illustrated in FIGS. 16A–16D. Referring to FIGS. 17A through 17B, the mask layer 650 has been removed, as set forth in block 155. Planarization and removal of the mask layer (see blocks 150, 155) were previously described above.

For any of the above-described embodiments, a reduced inner region 1132 of the original silicon body 331 remains. The inner region 1132 forms a "wire" that extends between a first end region (e.g., first outer region 633a of silicon body 331) and an opposing second end region (e.g., second outer region 633b of the silicon body), and the wire may be relatively narrower (in width or diameter) than the end regions. Further, the inner region or wire 1132 is spaced apart from and disposed above the underlying substrate. Thus, in one embodiment, what is formed is a free-standing wire extending between opposing ends, wherein the opposing ends are affixed to the underlying substrate. In one embodiment, this free-standing wire comprises a "nanowire" having a minimum width dimension of approximately 50 nm or less, features sizes which may be beyond the reach of some conventional lithography processes.

The structure shown in FIGS. 13A–13D, as well as the structure shown in FIGS. 17A–17D, may each be used to form an electrical device, such as a transistor. Therefore, with reference now to block 160, any other structure or structures may then be formed. For example, as shown in FIG. 18A, a transistor 1800a may be formed from the structure shown in FIGS. 13A–13D. A source region is formed (e.g., by performing ion implantation, etc.) in the first outer region 633a of silicon body 331 and a drain region is formed in the opposing second outer region 633b of this body, with the reduced inner region 1132 providing a channel region between the source and drain regions (again, this channel region may be doped prior to deposition of the gate insulating and gate electrode materials). Insulating spacers 1880a, 1880b (e.g., SiN) are formed around the gate electrode 1260. A first contact 1890a extends through a dielectric layer 1897 down to first outer region 633a of the silicon body 331, the first contact forming electrical contact with the source region. Similarly, a second contact 1890b extends through the dielectric layer 1897 down to the second outer region 633b of the silicon body, the second contact forming electrical contact with the drain region. Contacts 1890a, 1890b may comprise any suitable conductive material (e.g., copper). It should be understood that other schemes (e.g., self-aligned contacts) may be utilized to form electrical connections with the transistor.

Figure 18B:
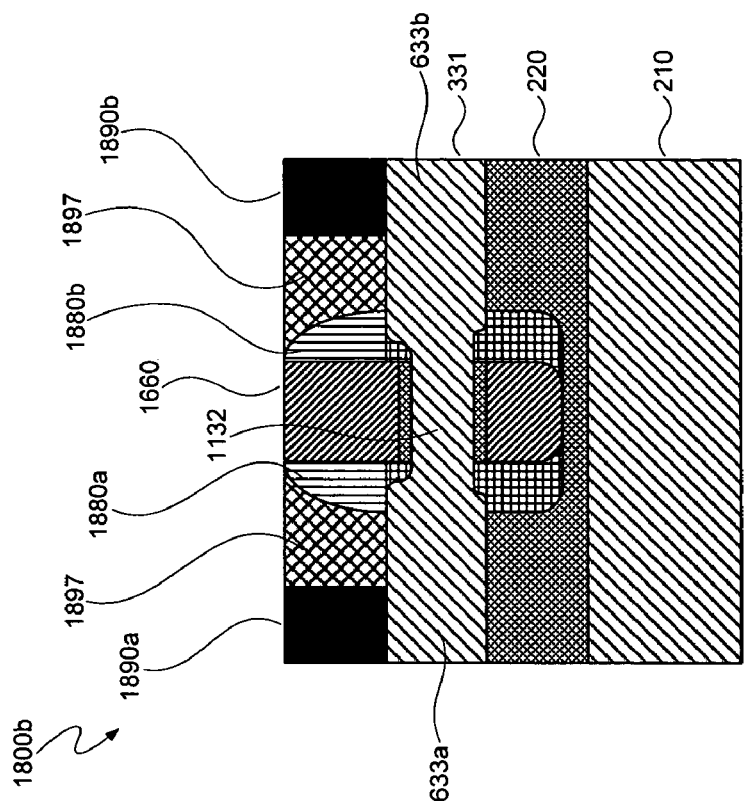
FIG. 18B is a schematic diagram illustrating another embodiment of a transistor including a wire formed according to one or more of the disclosed embodiments.
Figure 18A:
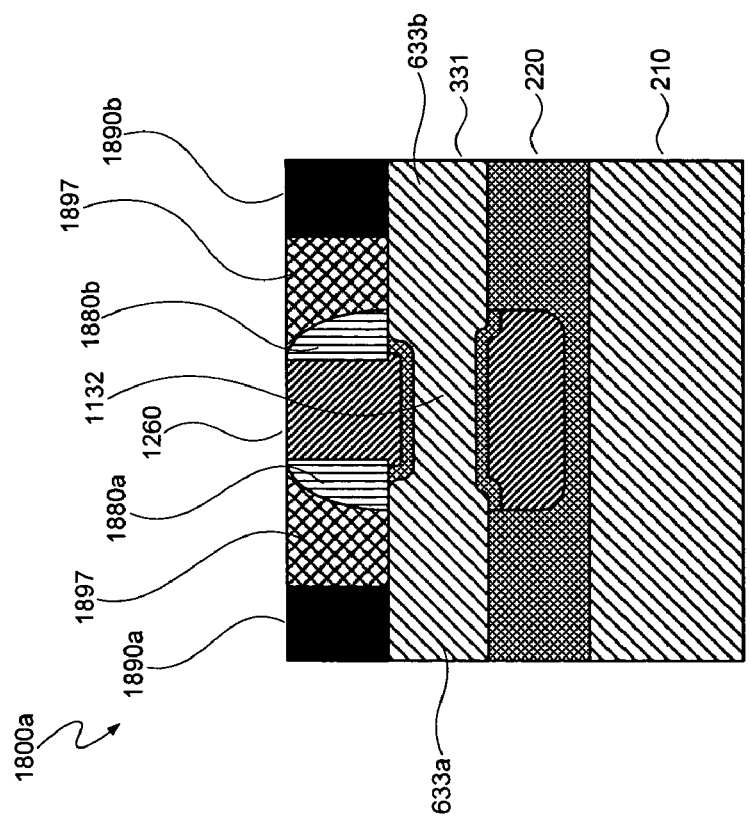
FIG. 18A is a schematic diagram illustrating an embodiment of a transistor including a wire formed according to one or more of the disclosed embodiments.

By way of further example, as shown in FIG. 18B, a transistor 1800b may be formed from the structure shown in FIGS. 17A–17D. A source region is formed (e.g., by performing ion implantation, etc.) in the first outer region 633a of silicon body 331 and a drain region is formed in the opposing second outer region 633b of this body, with the reduced inner region 1132 providing a channel region between the source and drain regions. Insulating spacers 1880a, 1880b (e.g., SiN) are formed around the gate, electrode 1660, and first and second contacts 1890a, 1890b extend through a dielectric layer 1897 down to the first and second outer regions 633a, 633b, respectively, of the silicon body 331. The first contact 1890a forms electrical contact with the source region, and the second contact 1890b forms electrical contact with the drain region. The contacts 1890a, 1890b may comprise any suitable conductive material (e.g., copper). Again, it should be understood that other schemes (e.g., self-aligned contacts) may be utilized to form electrical connections with the transistor.

For the above-described embodiments, two oxidation steps (see blocks 125 and 135 in FIG. 1) are performed to create a silicon wire. However, in another embodiment, a wire is formed using one oxidation step. By way of example, as shown by dashed line 191 in FIG. 1, the first oxidation process 125 is eliminated. After removal of the sacrificial layer, an etching process is performed (see block 130) to create the undercut region separating the exposed portion of the silicon body 331 from the underlying substrate 200, and then oxidation is performed (see block 135) to reduce the dimensions of the exposed portion of the silicon body. By way of further example, as shown by dashed line 192 in FIG. 1, after oxidation (see block 125) and oxide removal (see block 130), the exposed portion of the silicon body is separated from the underlying substrate 200 and is also reduced in dimensions, and the process continues with the deposition of the gate insulating and gate electrode materials (see bock 145).

A wire formed according to any of the embodiments described above may be used in the fabrication of a variety of different electronic devices or circuit elements. In one embodiment, as previously described, a wire formed according to the disclosed embodiments may be used to fabricate a transistor. Such a transistor may, in one embodiment, be used to fabricate a logic device or circuit. In a further embodiment, such a transistor may be used to fabricate a memory device or circuit—e.g., a DRAM memory or a SRAM memory—and an embodiment of a DRAM memory which utilizes one or more of the disclosed embodiments is described in FIGS. 19A through 19C and the accompanying text below.

Figure 19A:
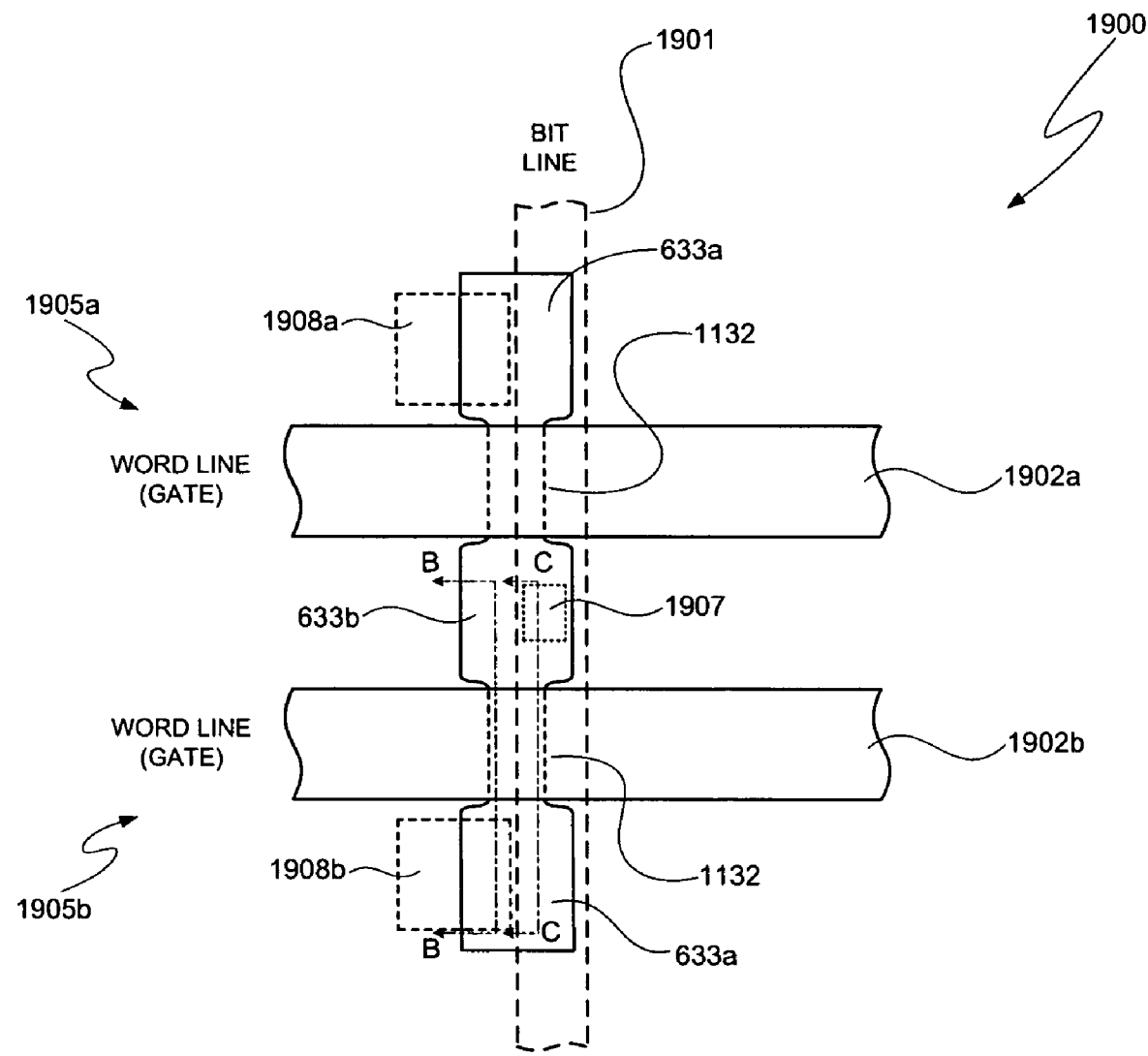

Turning now to FIGS. 19A to 19C, illustrated is an embodiment of a DRAM memory array 1900. A schematic plan view of the DRAM array is shown in FIG. 19A, whereas cross-sectional views of one cell of the array are shown in FIGS. 19B and 19C, as taken along lines B—B and C—C of FIG. 19A, respectively. It should be understood that, although FIG. 19A shows only two memory cells, such a memory array may include any arbitrary number of memory cells (e.g., a gigabit memory). Thus, it should be understood that FIGS. 19A–19C represent a simplified example presented as an aid to understanding the disclosed embodiments, and no unnecessary limitations should be drawn from these figures.

With reference to FIG. 19A, the memory array 1900 includes two memory cells 1905a and 1905b. Each of the memory cells includes a transistor comprising a wire 1132 extending between a first end 633a and an opposing second end 633b. The wire 1132 may be formed according to any one or more of the above-described embodiments. In each of the cells 1905a, 1905b a source region has been formed in the first end 633a, and a drain region has been formed in the opposing second end 633b. Further, the two neighboring cells 1905a, 1905b share a drain region 633b.

The memory array 1900 includes a number of word lines, including word lines 1902a and 1902b. Each of the word lines 1902a, 1902b comprises the gate electrode of the transistor of one (or more) memory cells. For example, the word line 1902a comprises the gate electrode of memory cells 1905a (and, perhaps, the gate electrode of a number of other memory cells in the same row). The word lines 1902a, 1902b (and gate electrodes) are further illustrated in FIGS. 19B and 19C, which show cross-sectional views of the memory cell 1905b (note that each of FIGS. 19B and 19C is similar, in part, to the structure shown in FIG. 18A). As shown in these figures, the word line 1902b comprises the gate electrode of a transistor, and this gate electrode wraps around the channel region 1132, as described above.

The memory array 1900 also includes a number of bit lines (e.g., conductive traces), including bit line 1901. The drain region 633b of each cell 1905a, 1905b is coupled to the bit line 1901. For example, a contact 1907 (e.g., a conductive via) couples the shared drain region of cells 1905a, 1905b to the bit line 1901. Note that other columns of memory cells may be disposed along other bit lines. Connection of a memory cell to the bit line 1901 is further illustrated in FIG. 19C, which illustrates the connections of bit line 1901 to the drain region 633b of cell 1905b. The bit line 1901 is coupled to this drain region 633b by a contact 1890b and the conductive via 1907, which extends through a dielectric layer 1922.

Each memory cell 1905a, 1905b includes a storage node capacitor (e.g., cell 1905a includes capacitor 1908a, and cell 1905b includes capacitor 1908b). The storage node capacitor 1908a, 1908b of each cell 1905a, 1905b, respectively, is coupled with the source region 633a of that cell's transistor, as shown in FIG. 19A. This is further illustrated in FIG. 19B, which shows the capacitor 1908b of cell 1905b coupled with the source region 633a of that cell. The capacitor 1908b is coupled with this source region by a contact 1890a (and isolated from adjacent cells by a dielectric layer 1921). The storage node capacitors 1908a, 1908b may comprise any suitable type of capacitor, such as MIM (metal-insulator-metal) capacitor or a trench capacitor.

For DRAM applications, the disclosed embodiments may provide a number of advantageous features. The gate electrode and reduced channel region are formed in a self-aligned manner, and this self-alignment can minimize the area of silicon needed to fabricate a device (e.g., by minimizing the needed gate length). However, while also minimizing the gate length for a device, this self-alignment can help to maximize the ratio of the gate length to the diameter of the channel region, which can reduce transistor leakage and lower the gate capacitance. As the reader will appreciate, higher transistor leakage in a memory cell can reduce the retention time of the cell's capacitor, and as memory devices are scaled down, this leakage may necessitate larger storage capacitors (on, perhaps, an even smaller semiconductor footprint). Thus, the reduced transistor leakage provided by the disclosed embodiments may assist in the scaling of memory devices. In addition, by reducing the gate length, the structural characteristics of the device may be improved.

Although FIGS. 19A through 19C illustrate application of the disclosed embodiments to a DRAM device, it should be understood that the disclosed embodiments may find application to other types of memory. For example, any of the disclosed embodiments may find application to a SRAM device. Note that, for SRAM devices, the relative transistor strengths (e.g., drain currents) between the pass-gate transistor and the pull-down transistor may be adjusted by varying the amount of reduction of the channel region (e.g., the inner region 1132) without impacting the memory cell area.

Figure 20:
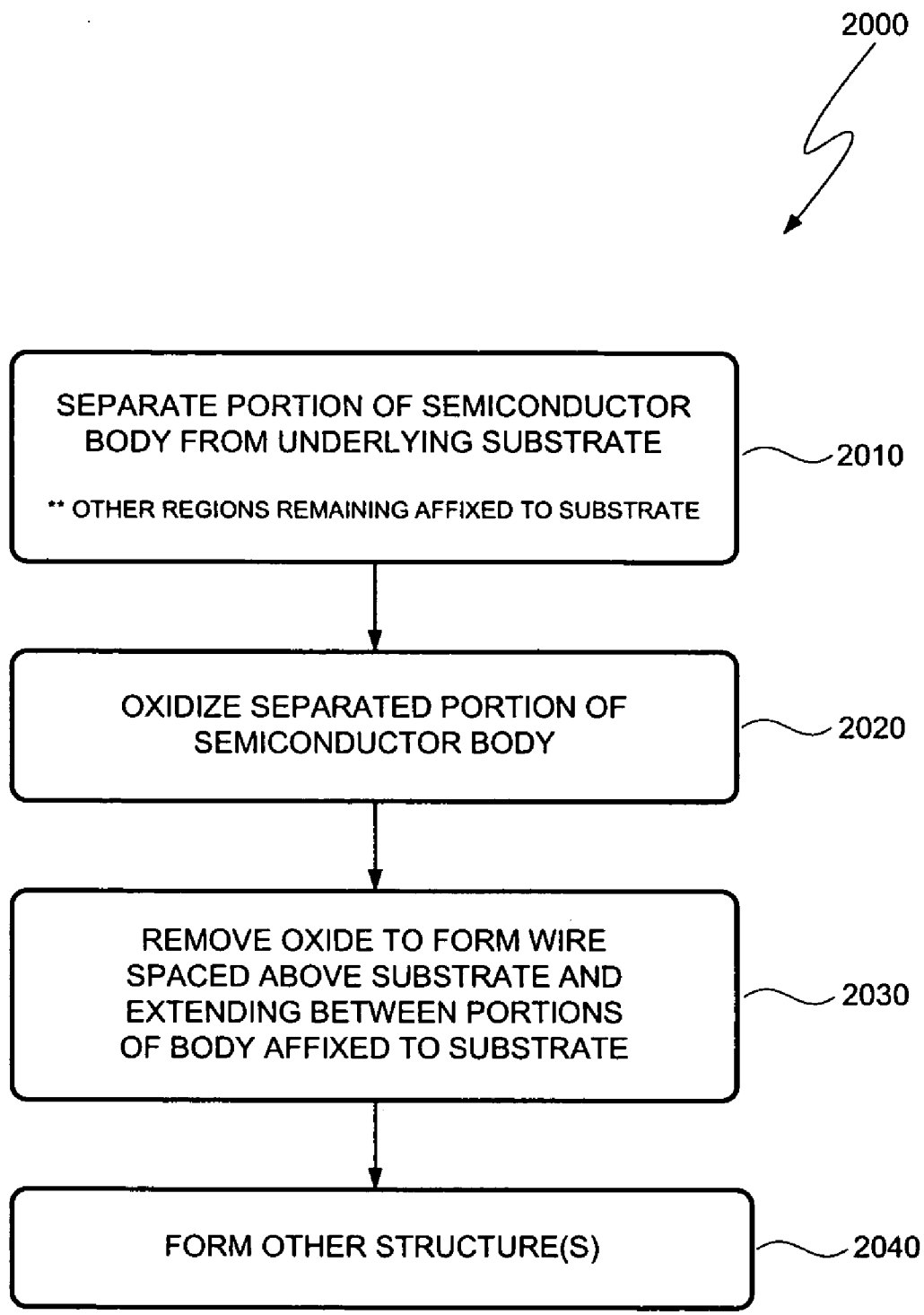
FIG. 20 is a block diagram illustrating another embodiment of a method for forming a wire from silicon or other semiconductor material.

Turning now to FIG. 20, illustrated is another embodiment of a method for forming a wire from silicon or other semiconductor material. Referring to block 2010, a portion of a semiconductor body is separated from an underlying substrate; however, other regions of the body remain affixed to the substrate. Any suitable process may be used to separate a portion of the semiconductor body from the substrate. For example, a region of the substrate underlying the semiconductor body may be removed and/or the semiconductor body may be oxidized (see block 2020) to form an oxide layer which is undercut etched to separate the remaining unoxidized portion of the semiconductor body from the substrate. As set forth in block 2020, the separated portion of the semiconductor body is oxidized (e.g., as by thermal oxidation). The oxide is then removed to form a wire spaced above the underlying substrate and extending between regions of the semiconductor body that are affixed to the substrate, which is set forth in block 2030. Any suitable process (e.g., etching) may be utilized to remove the oxide. As suggested above, the processes of oxidation and oxide removal may themselves lead to separation of a portion of the semiconductor body from the underlying substrate (e.g., the action denoted in block 2010 may be the result of the actions performed in blocks 2020 and 2030). Referring to block 2040, any other structure (or structures) may then be formed (e.g., to fabricate a transistor). In one embodiment, the semiconductor material comprises silicon, and in another embodiment, the substrate comprises an SOI wafer.

In the embodiments described above (see FIGS. 1 and 20), a semiconductor body may be reduced by thermal oxidation (or other oxidation process) to form a wire. It should be understood, however, that the disclosed embodiments are not limited to use of an oxidation process to perform this reduction. Rather, in other embodiments, alternative ways of performing reduction—such as, for example, etching—may be used in lieu of (or in combination with) oxidation.

Although a single wire 1132 is illustrated in the structures of each of FIGS. 13A–13D and 17A–17D, respectively, it should be understood that, in practice, the disclosed embodiments may be performed at the wafer level and that hundreds of millions of these wires (and resulting devices, such as transistors) may be formed on a single wafer. For example, referring to FIG. 21, a plan view of a wafer 2100 is shown. The wafer 2100 comprises a substrate 2105 (e.g., Si, SOI, etc.) upon which integrated circuitry for a number of die 2190 has been formed, and wafer 2100 is ultimately cut into these separate die 2190. Prior to singulation, millions of the disclosed wires structures (and resulting transistors) may be formed on the wafer 2100 for each of the die 2190.

Figure 22:
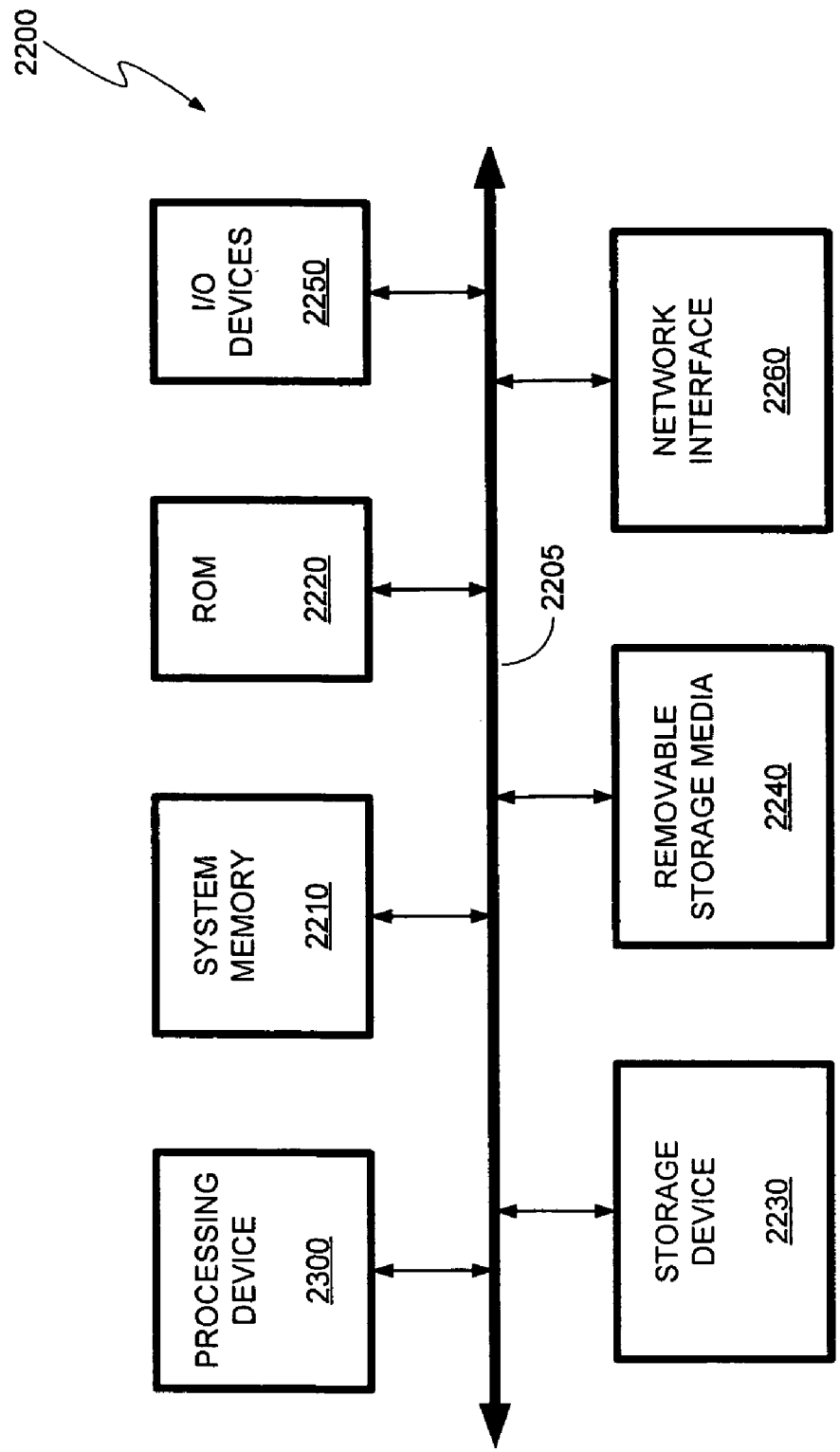
FIG. 22 is a schematic diagram illustrating an embodiment of a computer system, which may include a component having a circuit element formed according to one or more of the disclosed embodiments.

Referring to FIG. 22, illustrated is an embodiment of a computer system 2200. Computer system 2200 includes a bus 2205 to which various components are coupled. Bus 2205 is intended to represent a collection of one or more buses—e.g., a system bus, a Peripheral Component Interface (PCI) bus, a Small Computer System Interface (SCSI) bus, etc.—that interconnect the components of system 2200. Representation of these buses as a single bus 2205 is provided for ease of understanding, and it should be understood that the system 2200 is not so limited. Those of ordinary skill in the art will appreciate that the computer system 2200 may have any suitable bus architecture and may include any number and combination of buses.

Figure 21:
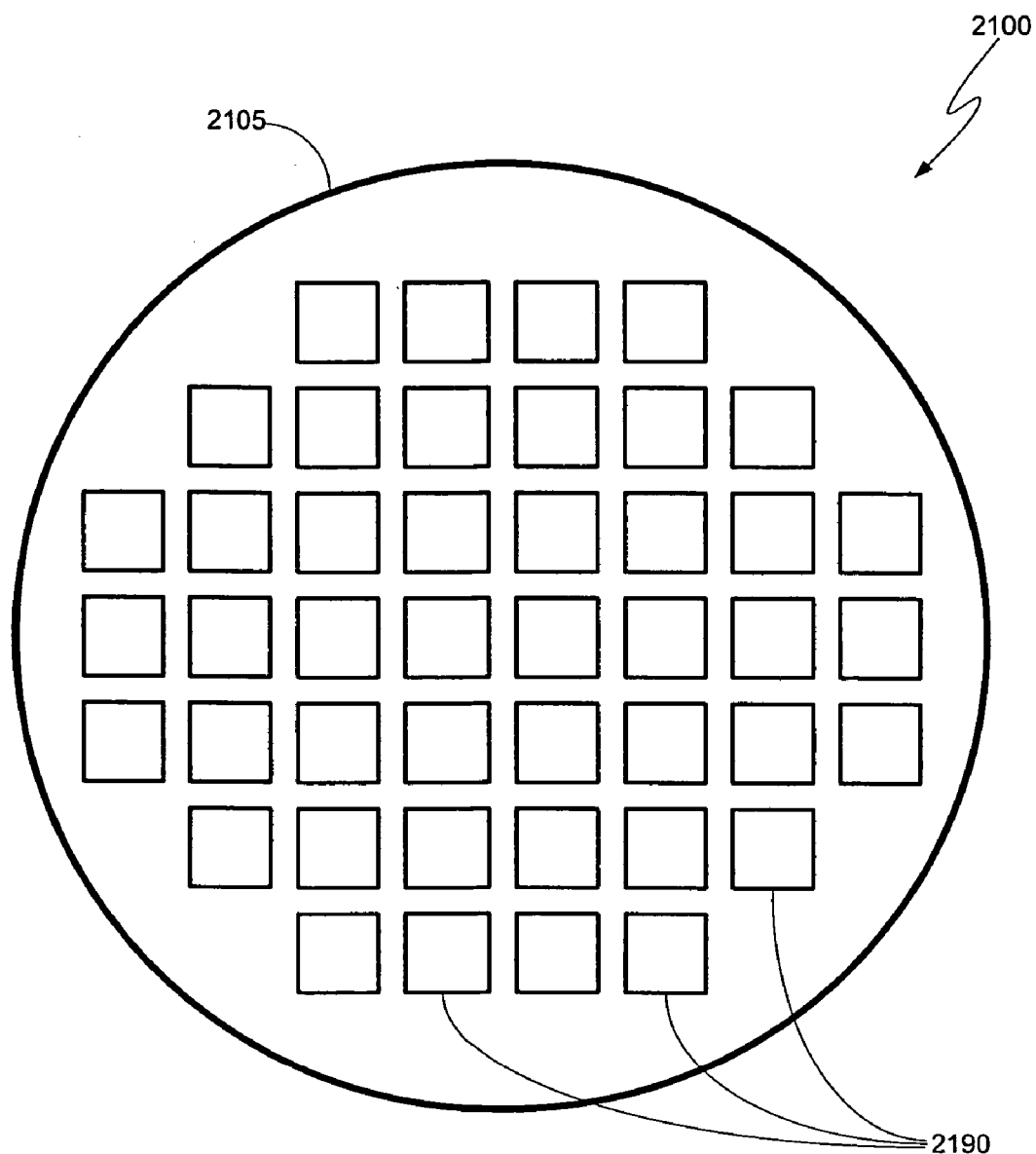
FIG. 21 is a schematic diagram illustrating an embodiment of a semiconductor wafer upon which any of the disclosed embodiments of a wire may be formed.
Figure 23:
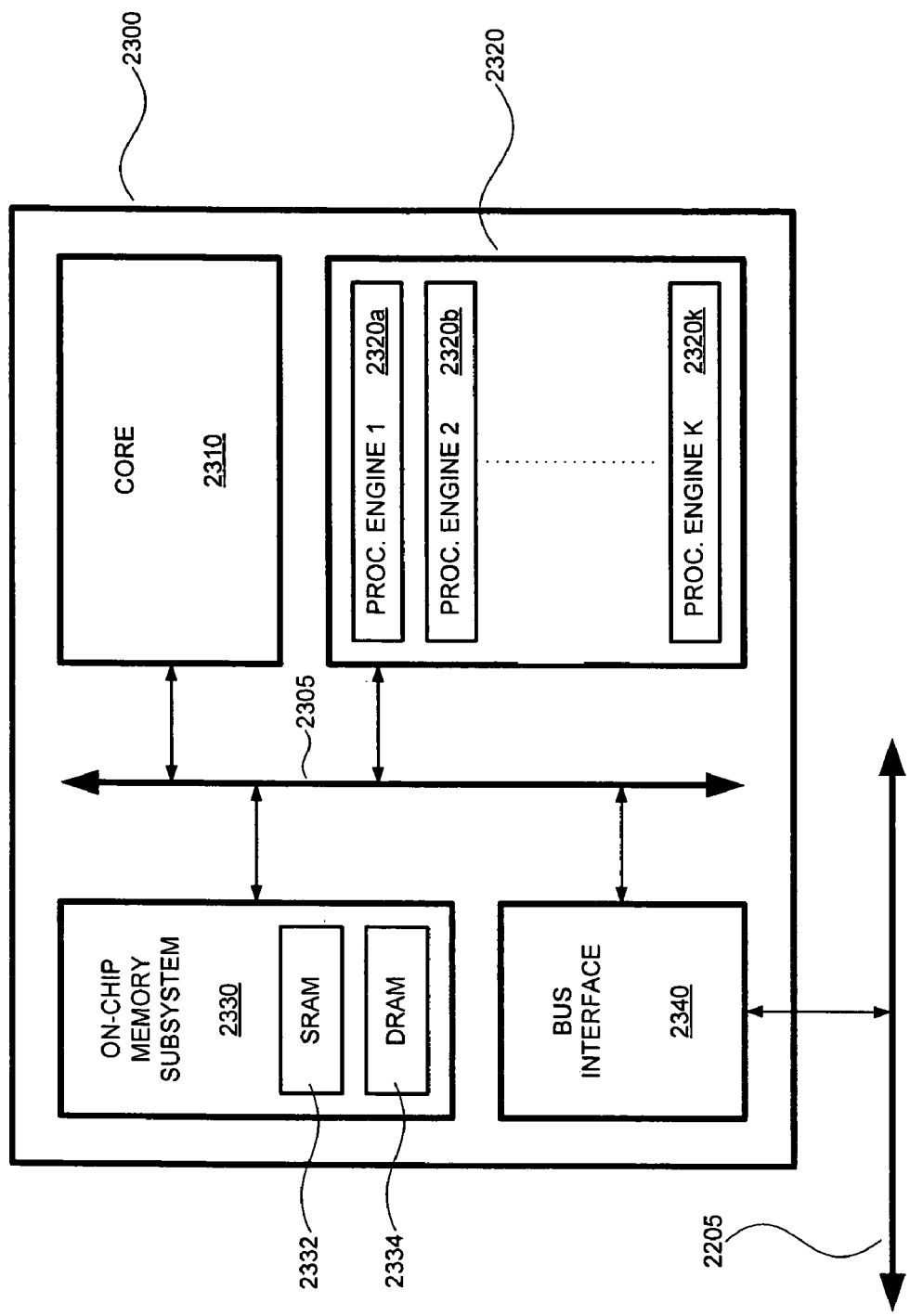
FIG. 23 is a schematic diagram illustrating an embodiment of a processing device, which may include circuitry formed according to one or more of the disclosed embodiments.

Coupled with bus 2205 is a processing device (or devices) 2300. The processing device 2300 may comprise any suitable processing device or system, including a microprocessor, a network processor, an application specific integrated circuit (ASIC), or a field programmable gate array (FPGA), or similar device. It should be understood that, although FIG. 21 shows a single processing device 2300, the computer system 2200 may include two or more processing devices. An embodiment of the processing device 2300 is illustrated in FIG. 23, which is described below.

Computer system 2200 also includes system memory 2210 coupled with bus 2205, the system memory 2210 comprising, for example, any suitable type and number of memories, such as static random access memory (SRAM), dynamic random access memory (DRAM), synchronous DRAM (SDRAM), or double data rate DRAM (DDRDRAM). During operation of computer system 2200, an operating system and other applications may be resident in the system memory 2210.

The computer system 2200 may further include a read-only memory (ROM) 2220 coupled with the bus 2205. During operation, the ROM 2220 may store temporary instructions and variables for processing device 2210. The system 2200 may also include a storage device (or devices) 2230 coupled with the bus 2205. The storage device 2230 comprises any suitable non-volatile memory, such as, for example, a hard disk drive. The operating system and other programs may be stored in the storage device 2230. Further, a device 2240 for accessing removable storage media (e.g., a floppy disk drive or a CD ROM drive) may be coupled with bus 2205.

The computer system 2200 may also include one or more I/O (Input/Output) devices 2250 coupled with the bus 2205. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 2200.

The computer system 2200 further comprises a network interface 2260 coupled with bus 2205. The network interface 2260 comprises any suitable hardware, software, or combination of hardware and software that is capable of coupling the system 2200 with a network (e.g., a network interface card). The network interface 2260 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 2200 illustrated in FIG. 22 is intended to represent an exemplary embodiment of such a system and, further, that this system may include many additional components, which have been omitted for clarity and ease of understanding. By way of example, the system 2200 may include a DMA (direct memory access) controller, a chip set associated with the processing device 2210, additional memory (e.g., a cache memory), as well as additional signal lines and buses. Also, it should be understood that the computer system 2200 may not include all of the components shown in FIG. 22.

As previously noted, an embodiment of processing device 2300 is illustrated in FIG. 23 and the accompanying text. Turning now to this figure, the processing device 2300 includes a local bus 2305 to which various functional units are coupled. Bus 2305 is intended to represent a collection of one or more on-chip buses that interconnect the various functional units of processing device 2300. Representation of these local buses as a single bus 2305 is provided for ease of understanding, and it should be understood that the processing device 2300 is not so limited. Those of ordinary skill in the art will appreciate that the processing device 2300 may have any suitable bus architecture and may include any number and combination of buses.

A core 2310 and a number of processing engines 2320 (e.g., processing engines 2320a, 2320b, . . . , 2320k) are coupled with the local bus 2305. In one embodiment, the core 2310 comprises a general purpose processing system, which may execute an operating system. Core 2310 may also control operation of processing device 2300 and perform a variety of management functions, such as dispensing instructions to the processing engines 2320 for execution. Each of the processing engines 2320a–k comprises any suitable processing system, and each may include an arithmetic and logic unit (ALU), a controller, and a number of registers (for storing data during read/write operations). Also, in one embodiment, each processing engine 2320a–k provides for multiple threads of execution (e.g., four).

Also coupled with the local bus 2305 is an on-chip memory subsystem 2330. Although depicted as a single unit, it should be understood that the on-chip memory subsystem 2330 may—and, in practice, likely does—comprise a number of distinct memory units and/or memory types. For example, such on-chip memory may include SRAM 2332 and/or DRAM 2334 (e.g., SDRAM or DDRDRAM), as well as flash memory (e.g., FlashROM). It should be understood that, in addition to on-chip memory, the processing device 2300 may be coupled with off-chip memory (e.g., ROM 2220, off-chip cache memory, etc.).

Processing device 2300 further includes a bus interface 2340 coupled with local bus 2305. Bus interface 2340 provides an interface with other components of computer system 2200, including bus 2205. For simplicity, bus interface 2340 is depicted as a single functional unit; however, it should be understood that, in practice, the processing device 2300 may include multiple bus interfaces. For example, the processing device 2300 may include a PCI bus interface, an IX (Internet Exchange) bus interface, as well as others, and the bus interface 2340 is intended to represent a collection of one or more such interfaces.

It should be understood that the embodiment of processing device 2300 illustrated and described with respect to FIG. 23 is but one example of a processing device that may find use with the computer system 2200 of FIG. 22 and, further, that the processing device 2300 may have other components in addition to those shown in FIG. 23, which components have been omitted for clarity and ease of understanding. For example, the processing device 2300 may include other functional units (e.g., an instruction decoder unit, an address translation unit, etc.), a thermal management system, clock circuitry, additional memory, and registers. Also, it should be understood that a processing device may not include all of the elements shown in FIG. 23.

In one embodiment, a component of computer system 2200 includes a semiconductor wire (e.g., a silicon wire) formed according to one or more of the disclosed embodiments. According to one embodiment, the processing device 2300 of computer system 2200 may include one or more transistors (e.g., millions of such devices) that have been formed from any of the disclosed wire structures (e.g., see FIGS. 18A and 18B). In one embodiment, core 2310 and/or a processing engine 2320 includes a transistor (or transistors) formed according to one or more of the disclosed embodiments. In another embodiment, the memory subsystem 2330 includes a transistor (or transistors) formed according to one or more of the disclosed embodiments. For example, in one embodiment, the processing device 2300 comprises a DRAM memory 2334 that includes such a transistor (e.g., see FIGS. 19A–19C), and a further embodiment, the processing device comprises a SRAM memory 2332 including such a transistor. According to yet another embodiment, the system memory 2210 of system 2200 (e.g., a DRAM device) includes one or more transistors (e.g., millions) that have been formed from any of the disclosed wire structures. It should be understood, however, that other components of system 2200 (e.g., network interface 2260, etc.) may include a device formed according to the disclosed embodiments. Again, in one embodiment, the disclosed wires comprise "nanowires."

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A structure comprising:
   a first end region affixed to an insulating layer of a substrate, the substrate including a layer of a first semiconductor material underlying the insulating layer;
   an opposing second end region affixed to the insulating layer of the substrate; and
   an inner region extending between the first and second end regions and spaced apart from the substrate, wherein the first end region, the inner region, and the second end region comprise a single body of a second semiconductor material that does not contact the underlying first semiconductor material layer;
   wherein the inner region is narrower than the first and second end regions in both a height dimension and a width dimension.

2. The structure of claim 1, further comprising:
   a source region formed at the first end region and a drain region formed at the second end region, wherein the inner region provides a channel region between the source and drain regions;
   a layer of an insulating material disposed over the inner region; and
   a layer of a conductive material disposed over the insulating layer.

3. The structure of claim 1, wherein the substrate comprises a wafer including circuitry for a number of dies.

4. The structure of claim 1, wherein the first semiconductor material and the second semiconductor material each comprise silicon.

5. The structure of claim 1, wherein at least one of the width dimension and the height dimension of the inner region is less than approximately 50 nm.

6. An apparatus comprising:
   a substrate including a layer of an insulating material disposed on a layer of a first semiconductor material; and
   a transistor disposed on the substrate, the transistor including a single body of a second semiconductor material that does not contact the first semiconductor material layer, the body including a first end region affixed to the insulating layer, an opposing second end region affixed to the insulating layer, and an inner region extending between the first and second end regions and spaced apart from the substrate, a source region formed at the first end region and a drain region formed at the second end region, wherein the inner region provides a channel region between the source and drain regions, a layer of a gate insulating material disposed over the inner region, and a layer of a gate electrode material disposed over the gate insulating layer, wherein the inner region of the semiconductor body is relatively narrower than the first and second end regions.

7. The apparatus of claim 6, wherein the first semiconductor material and the second semiconductor material each comprise silicon.

8. The apparatus of claim 6, wherein the gate electrode material comprises polysilicon.

9. The apparatus of claim 6, wherein the inner region of the semiconductor body has a width dimension of less than approximately 50 nm.

10. The apparatus of claim 6, wherein the substrate comprises part of a semiconductor die.

11. The apparatus of claim 10, wherein the transistor comprises part of a static random access memory (SRAM) formed on the die.

12. The apparatus of claim 10, wherein the transistor comprises part of a dynamic random access memory (DRAM) formed on the die.

13. The apparatus of claim 10, wherein the die comprises a processing device and the transistor comprises part of a memory disposed on the die.

14. The apparatus of claim 13, wherein the memory comprises a DRAM or a SRAM.

15. The apparatus of claim 10, wherein the die comprises a processing device and the transistor comprises part of a logic circuit.

16. A system comprising:
a memory device; and
a processing device coupled with the memory device, the processing device including
a substrate including a layer of an insulating material disposed on a layer of a first semiconductor material; and
a transistor disposed on the substrate, the transistor including
a single body of a second semiconductor material that does not contact the first semiconductor material layer, the body including a first end region affixed to the insulating layer, an opposing second end region affixed to the insulating layer, and an inner region extending between the first and second end regions and spaced apart from the substrate, a source region formed at the first end region and a drain region formed at the second end region, wherein the inner region provides a channel region between the source and drain regions, a layer of a gate insulating material disposed over the inner region, and a layer of a gate electrode material disposed over the gate insulating layer, wherein the inner region of the semiconductor body is relatively narrower than the first and second end regions.

17. The system of claim 16, wherein the first and second semiconductor materials each comprise silicon.

18. The system of claim 16, wherein the gate electrode material comprises polysilicon.

19. The system of claim 16, wherein the inner region of the semiconductor body has a width dimension of less than approximately 50 nm.

20. The system of claim 16, wherein the transistor comprises part of a memory formed on the substrate.

21. The system of claim 20, wherein the memory comprises a static random access memory (SRAM) or a dynamic random access memory (DRAM).

22. The system of claim 16, wherein the transistor comprises part of a logic circuit.

23. A memory comprising:
a substrate including a layer of an insulating material disposed on a layer of a first semiconductor material;
a transistor disposed on the substrate, the transistor including
a single body of a second semiconductor material that does not contact the first semiconductor material layer, the body including a first end region affixed to the insulating layer, an opposing second end region affixed to the insulating layer, and an inner region extending between the first and second end regions and spaced apart from the substrate, a source region formed at the first end region and a drain region formed at the second end region, wherein the inner region provides a channel region between the source and drain regions, a layer of a gate insulating material disposed over the inner region, and a layer of a gate electrode material disposed over the gate insulating layer; and a capacitor disposed on the substrate and electrically coupled with the source region, wherein the inner region of the semiconductor body is relatively narrower than the first and second end regions.

24. The memory of claim 23, further comprising a bit line electrically coupled with the drain region.

25. The memory of claim 23, wherein the drain region is shared with an adjacent memory cell.

* * * * *